US009780235B2

(12) United States Patent
Adachi

(10) Patent No.: US 9,780,235 B2
(45) Date of Patent: Oct. 3, 2017

(54) SOLAR CELL, MANUFACTURING METHOD THEREFOR, SOLAR CELL MODULE, AND MANUFACTURING METHOD THEREFOR

(71) Applicant: KANEKA CORPORATION, Osaka-shi, Osaka (JP)

(72) Inventor: Daisuke Adachi, Settsu (JP)

(73) Assignee: KANEKA CORPORATION, Osaka-shi, Osaka (JP)

(*) Notice: Subject to any disclaimer, the term of this patent is extended or adjusted under 35 U.S.C. 154(b) by 17 days.

(21) Appl. No.: 14/893,492

(22) PCT Filed: May 29, 2014

(86) PCT No.: PCT/JP2014/064349
§ 371 (c)(1),
(2) Date: Nov. 23, 2015

(87) PCT Pub. No.: WO2014/192899
PCT Pub. Date: Dec. 4, 2014

(65) Prior Publication Data
US 2016/0126370 A1 May 5, 2016

(30) Foreign Application Priority Data
May 29, 2013 (JP) .................................. 2013-113523

(51) Int. Cl.
*H01L 31/0216* (2014.01)
*H01L 31/0224* (2006.01)
(Continued)

(52) U.S. Cl.
CPC .................. *H01L 31/02168* (2013.01); *H01L 31/022425* (2013.01); *H01L 31/022466* (2013.01);
(Continued)

(58) Field of Classification Search
CPC ................ H01L 2221/1084; H01L 2221/1089
See application file for complete search history.

(56) References Cited

U.S. PATENT DOCUMENTS

| 4,586,988 A | 5/1986 | Nath et al. |
| 4,654,468 A * | 3/1987 | Nath .................. H01L 31/02161 136/249 |

(Continued)

FOREIGN PATENT DOCUMENTS

| JP | S6066426 A | 4/1985 |
| JP | 2000058885 A | 2/2000 |

(Continued)

OTHER PUBLICATIONS

Garelick Steel, "Melting Points of Common Metals", 2011, www.garelicksteel.com, p. 1.*

(Continued)

*Primary Examiner* — Devina Pillay
*Assistant Examiner* — Daniel Malley, Jr.
(74) *Attorney, Agent, or Firm* — Alleman Hall Creasman & Tuttle LLP

(57) ABSTRACT

A solar cell of the present invention includes a collecting electrode extending in one direction on a first principal surface of a photoelectric conversion section. The collecting electrode includes first and second electroconductive layers in this order from the photoelectric conversion section side, and further includes an insulating layer provided with openings between the electroconductive layers. The first electroconductive layer is covered with the insulating layer, and the second electroconductive layer is partially in conduction with the first electroconductive layer through the openings of the insulating layer. The first electroconductive layer has non-central portions within a range from both ends of the first electroconductive layer, and a central portion between the two non-central portions, in a direction orthogonal to an
(Continued)

extending direction of the first electroconductive layer. A density of openings at the central portion is higher than a density of openings at the non-central portion.

18 Claims, 7 Drawing Sheets

(51) Int. Cl.
*H01L 31/0747* (2012.01)
*H01L 31/20* (2006.01)

(52) U.S. Cl.
CPC ........ *H01L 31/0747* (2013.01); *H01L 31/202* (2013.01); *H01L 31/208* (2013.01); *Y02E 10/50* (2013.01)

(56) References Cited

U.S. PATENT DOCUMENTS

| | | | |
|---|---|---|---|
| 6,191,353 B1* | 2/2001 | Shiotsuka | B32B 17/04 136/256 |
| 2012/0240998 A1* | 9/2012 | Ballif | H01L 31/022425 136/256 |
| 2012/0291844 A1 | 11/2012 | Tsuge | |
| 2013/0288423 A1* | 10/2013 | Takahama | H01L 31/022441 438/96 |
| 2014/0360567 A1* | 12/2014 | Seutter | H01B 1/023 136/256 |

FOREIGN PATENT DOCUMENTS

| | | |
|---|---|---|
| JP | 2010098232 A | 4/2010 |
| JP | 2011199045 A | 10/2011 |
| JP | 2013507781 A | 3/2013 |
| WO | 2011045287 A1 | 4/2011 |
| WO | 2011115206 A1 | 9/2011 |
| WO | 2012029847 A1 | 3/2012 |
| WO | 2013014810 A1 | 1/2013 |

OTHER PUBLICATIONS

ISA Japanese Patent Office, International Search Report Issued in Application No. PCT/JP2014/064349, Jun. 24, 2014, WIPO, 4 pages.

European Patent Office, Extended European Search Report Issued in Application No. 14803901.9, Mar. 21, 2016, Germany, 8 pages.

* cited by examiner

SOLAR CELL, MANUFACTURING METHOD THEREFOR, SOLAR CELL MODULE, AND MANUFACTURING METHOD THEREFOR

TECHNICAL FIELD

The present invention relates to a solar cell and a manufacturing method thereof. Further, the present invention relates to a solar cell module and a manufacturing method thereof.

BACKGROUND ART

Since energy issues and global environmental issues are becoming more serious, solar cells are receiving more attention as alternative energy for replacing fossil fuels. In the solar cells, carriers (electrons and holes) generated by light irradiation to a photoelectric conversion section composed of a semiconductor junction or the like are extracted to an external circuit to generate electricity. A collecting electrode is provided on the photoelectric conversion section of the solar cell for efficiently extracting carriers generated at the photoelectric conversion section to the external circuit.

For example, in a crystalline silicon-based solar cell using a single-crystalline silicon substrate or a polycrystalline silicon substrate, a collecting electrode made of a fine metal is provided on a light-receiving surface. Also, in a heterojunction solar cell having amorphous silicon layers and transparent electrode layers on a crystalline silicon substrate, collecting electrode(s) are provided on the transparent electrode layer(s).

The collecting electrode of the solar cell is generally formed by pattern-printing a silver paste by a screen printing method. This method is simple in terms of the process itself, but has such a problem that the material cost of silver is high, and that the resistivity of the collecting electrode increases because a silver paste material containing a resin is used. For decreasing the resistivity of the collecting electrode formed of a silver paste, it is necessary to thickly print the silver paste. However, since the line width of the electrode increases with the increase of the print thickness, thinning of the electrode is difficult, and the shading area of the collecting electrode increases.

As a solution to these problems, a method is known in which a collecting electrode is formed by a plating method which is excellent in terms of material and process costs. For example, Patent Documents 1 to 3 disclose a solar cell in which a metallic layer made of copper or the like is formed by a plating method on a transparent electrode that forms a photoelectric conversion section. In this method, first, a resist material layer (insulating layer) having an opening matching the shape of a collecting electrode is formed on the transparent electrode layer of the photoelectric conversion section, and a metallic layer is formed at the resist opening section on the transparent electrode layer by electroplating. Thereafter, the resist is removed to form a collecting electrode having a predetermined shape. Patent Document 3 discloses that the line width of a plating electrode is made equal to or less than that of an under-layer electrode by forming the plating electrode layer using a mask after a formation of the under-layer electrode.

Patent Document 4 discloses a method in which an insulating layer of $SiO_2$ or the like is provided on a transparent electrode, a groove extending through the insulating layer is then provided to expose the surface or side surface of the transparent electrode layer, and a metal collecting electrode is formed so as to be in conduction with an exposed area of the transparent electrode. Specifically, a method is proposed in which a metal seed is formed on the exposed area of the transparent electrode layer by a light induced plating method or the like, and a metal electrode is formed by electroplating with the metal seed as an origination point. This method is more advantageous in terms of material costs and process costs because it is not necessary to use a resist unlike Patent Documents 1 and 2. By providing a low-resistance metal seed, the contact resistance between a transparent electrode layer and a collecting electrode can be lowered.

Patent Document 5 discloses a method in which an electroconductive seed having proper roughness and porosity is provided, an insulating layer is formed on the electroconductive seed, discontinuous openings are formed in the insulating layer on the electroconductive seed, and a collecting electrode is formed by plating with the openings as origination points.

PRIOR ART DOCUMENTS

Patent Documents

Patent Document 1: JP-60-66426
Patent Document 2: JP-A-2000-58885
Patent Document 3: JP-A-2010-98232
Patent Document 4: JP-A-2011-199045
Patent Document 5: WO2011/045287

SUMMARY OF THE INVENTION

Problems to be Solved by the Invention

Use of a mask matching a collecting electrode pattern as in Patent Document 3 has such a problem that it is not feasible for practical use because of the necessary expenses and man-hours for preparing the mask.

According to the method in Patent Document 4, a collecting electrode with a thin-line pattern can be formed by a plating method without using an expensive resist material. However, a method of forming a metal seed serving as an origination point of electroplating using a light induced plating method can be applied to the n-layer side of a semiconductor junction, but cannot be applied to the p-layer side. Generally, heterojunction solar cells are known to have the highest characteristic of a configuration in which an n-type single-crystalline silicon substrate is used and a heterojunction on the p-layer side is on the light-receiving side, and the method in Patent Document 4 has the problem that it is not suitable for formation of a collecting electrode on the light-receiving side in a heterojunction solar cell in which the p-layer side is on the light-receiving side. Further, in Patent Document 4, the side surface of a transparent electrode layer and a metal collecting electrode are in contact with each other in a groove extending through an insulating layer and the transparent electrode layer, but the contact area between the former and the latter is small because the thickness of the transparent electrode layer is generally about 100 nm. Therefore, there is the problem that the resistance between the transparent electrode and the collecting electrode increases, so that a function as a collecting electrode cannot be exhibited very well.

In the method disclosed in Patent Document 5, the electroconductive seed locally has no insulating layer at a portion where the surface thereof is significantly changed in shape (rugged), and thus openings A are formed in the insulating layer. In this method, the contact area between the electroconductive seed and the plating metal electrode layer is made larger as compared to the method described in Patent Document 4. The method in Patent Document 5 is applicable to both the p-layer side and n-layer side of a semiconductor junction in a solar cell. However, it is thought that openings A of the insulating layer are easily formed on the periphery of the end of an electroconductive seed-formed region because the thickness of the electroconductive seed is sharply changed in the vicinity of the end of the electroconductive seed-formed region (boundary between the electroconductive seed-formed region and an electroconductive seed-non-formed region). When a metallic layer is deposited by plating with the end of the electroconductive seed-formed region as an origination point, a metal is also deposited on the electroconductive seed-non-formed region (see FIG. 12: FIG. 4c in Patent Document 4), and therefore the shading area by the collecting electrode increases, leading to a decrease in amount of power generation of the solar cell.

It is an object of the present invention to improve conversion efficiency of the solar cell and reduce manufacturing costs of the solar cell by solving problems of the prior art associated with formation of a collecting electrode of the solar cell as described above.

Means for Solving the Problems

As a result of conducting vigorous studies in view of the above-mentioned problems, the inventors have found that when openings of an insulating layer formed on an electroconductive seed are unevenly distributed to a central portion of a collecting electrode in a width direction, the shading area by the collecting electrode can be reduced to improve conversion efficiency of a solar cell. Thus, the present invention has been devised.

The present invention relates to a solar cell having a collecting electrode extending in one direction on a first principal surface of a photoelectric conversion section, and to a solar cell module including the solar cell. The collecting electrode includes a first electroconductive layer and a second electroconductive layer in this order from the photoelectric conversion section side, and further includes an insulating layer provided with openings between the first electroconductive layer and the second electroconductive layer. The first electroconductive layer is covered with the insulating layer, and the second electroconductive layer is partially in conduction with the first electroconductive layer through the openings of the insulating layer.

The first electroconductive layer has non-central portions $L_O$ within a range of $d_2-d_I$ from both ends of the first electroconductive layer, respectively, and a central portion between the two non-central portions, in a direction orthogonal to an extending direction of the first electroconductive layer. A density $S_C$ of openings of the insulating layer on the first electroconductive layer at the central portion is higher than a density $S_O$ of openings of the insulating layer on the first electroconductive layer at the non-central portion. Here, $d_I$ is a thickness of the insulating layer and $d_2$ is a thickness of the second electroconductive layer.

The central portion and the non-central portion will be described more in detail. In the set of points positioned at fixed intervals in the extending direction of the first electroconductive layer from one end (point $s_1$) of a region X on the first electroconductive layer: $S=\{s_1, s_2, \ldots, s_N, \ldots, s_u\}$ ($N=1, 2, \ldots, u$; $s_u$ is the other end of the region X), points included in each of the sets of boundary points between the central portion and the non-central portion: $B_A=\{b_{A1}, b_{A2}, \ldots, b_{AN}, \ldots, b_{Au}\}$ ($N=1, 2, \ldots, u$) and $B_B=\{b_{B1}, b_{B2}, \ldots, b_{BN}, \ldots, b_{Bu}\}$ ($N=1, 2, \ldots, u$) are connected one after another. A region sandwiched between the two lines thus formed is the central portion ($L_c$), and a region other than the central portion of the first electroconductive layer is the non-central portion ($L_o$).

Here, $A_N$: straight line which passes through point $S_N$ and is orthogonal to the extending direction of the first electroconductive layer;

$E_{NA}$, $E_{NB}$: intersection between $A_N$ and each of both ends of first electroconductive layer;

$L_N$: distance between $E_{NA}$ and $E_{NB}$ (line width of first electroconductive layer at $S_N$):

$C_N$: middle point between $E_{NA}$ and $E_{NB}$:

Boundary points between the central portion and the non-central portion at $S_N$: a point at which a distance from $C_N$ is $L_N/2-(d_2-d_1)$ on the straight line $A_N$ (where the point on the $E_{NA}$ side is $b_{AN}$ and the point on the $E_{NB}$ side is $b_{BN}$).

Preferably, the first electroconductive layer contains a low-melting-point material having a thermal-fluidization onset temperature $T_1$ lower than the heat-resistant temperature of the photoelectric conversion section, and the low-melting-point material is unevenly distributed to the central portion of the first electroconductive layer. In this case, it is preferred that the low-melting-point material is formed in a plurality of island-like regions, and the distance $d_{PL}$ between one of the island-like regions and an island-like region closest thereto satisfies the relationship of $d_{PL} \leq 2 \times (d_2-d_I)$.

In one embodiment of the solar cell of the present invention, the photoelectric conversion section includes a silicon-based thin-film and a transparent electrode layer in this order on a first principal surface of a crystalline silicon substrate, and the collecting electrode is provided on the transparent electrode layer.

A manufacturing method of the solar cell of the present invention includes a step of forming the first electroconductive layer on the first principal surface of the photoelectric conversion section (first electroconductive layer forming step), a step of forming the insulating layer on the first electroconductive layer (insulating layer forming step), and a step of forming the second electroconductive layer conduction with the first electroconductive layer by a plating method through the openings provided in the insulating layer (plating step), in this order. The openings of the insulating layer are formed so as to be unevenly distributed to a central portion on the first electroconductive layer.

The first electroconductive layer is formed by, for example, applying onto the first principal surface of the photoelectric conversion section a coating material having a viscosity of 10 to 500 Pa·s, and then curing the coating material. Preferably, the first electroconductive layer contains a low-melting-point material having a thermal-fluidization onset temperature $T_1$ lower than the heat-resistant temperature of the photoelectric conversion section.

After formation of the insulating layer, openings can be formed in the insulating layer on the first electroconductive layer by performing a heat treatment at an annealing temperature Ta higher than the thermal-fluidization onset temperature $T_1$ of the low-melting-point material. When the insulating layer is formed at a substrate temperature Tb higher than the thermal-fluidization onset temperature $T_1$ of the low-melting-point material, openings can be formed in the insulating layer on the first electroconductive layer in parallel to formation of the insulating layer.

Effects of the Invention

According to the present invention, a collecting electrode can be formed by a plating method, and therefore the collecting electrode is made less resistive, so that conversion efficiency of a solar cell can be improved. Since the second electroconductive layer is formed at the central portion on the first electroconductive layer by a plating method, the width of the collecting electrode can be reduced, so that the collecting electrode with a small shading area can be formed. Thus, a solar cell having high efficiency can be provided inexpensively.

DESCRIPTION OF EMBODIMENTS

Figure 1:
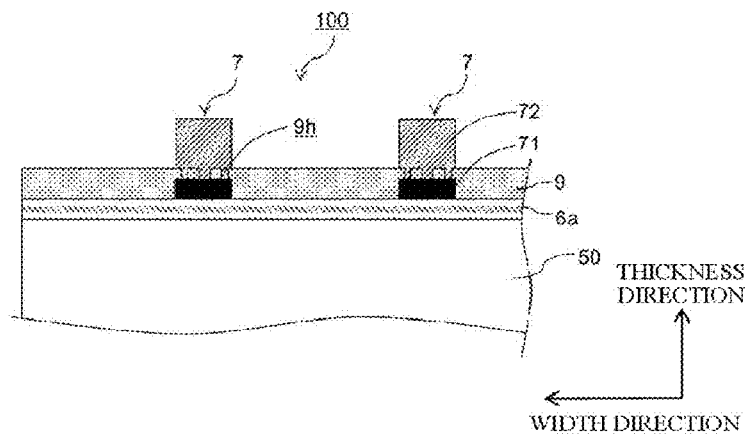
FIG. 1 is a schematic sectional view showing one embodiment of a solar cell of the present invention.

As schematically shown in FIG. 1, a solar cell 100 of the present invention includes a collecting electrode 7 on a first principal surface of a photoelectric conversion section 50. The collecting electrode 7 includes a first electroconductive layer 71 and a second electroconductive layer 72 in this order from the photoelectric conversion section 50 side. An insulating layer 9 having openings is formed between the first electroconductive layer 71 and the second electroconductive layer 72. A part of the second electroconductive layer 72 is conductively connected with the first electroconductive layer 71 via, for example, the openings 9h of the insulating layer 9.

The insulating layer 9 on the first electroconductive layer is formed such that the density of openings at a central portion is higher than the density of openings at a non-central portion. Preferably, the first electroconductive layer 71 contains a low-melting-point material having a thermal-fluidization onset temperature $T_1$ which is lower than the heat-resistant temperature of the photoelectric conversion section 50. The thermal-fluidization onset temperature $T_1$ is, for example, 250° C. or lower. When the first electroconductive layer contains a low-melting-point material, it is preferred that the low-melting-point material in the first electroconductive layer is positioned such that the extant density at the central portion is higher than the extant density at the non-central portion.

The present invention will be described more in detail below taking as an example a heterojunction crystalline silicon solar cell (herein referred to as a "heterojunction solar cell" in some cases) as one embodiment of the present invention. The heterojunction solar cell is a crystalline silicon-based solar cell in which a silicon-based thin-film having a band gap different from that of a single-crystalline silicon is formed on a surface of a single-crystalline silicon substrate of a first conductivity type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is one configuration of crystalline silicon solar cell with high conversion efficiency.

Figure 2:
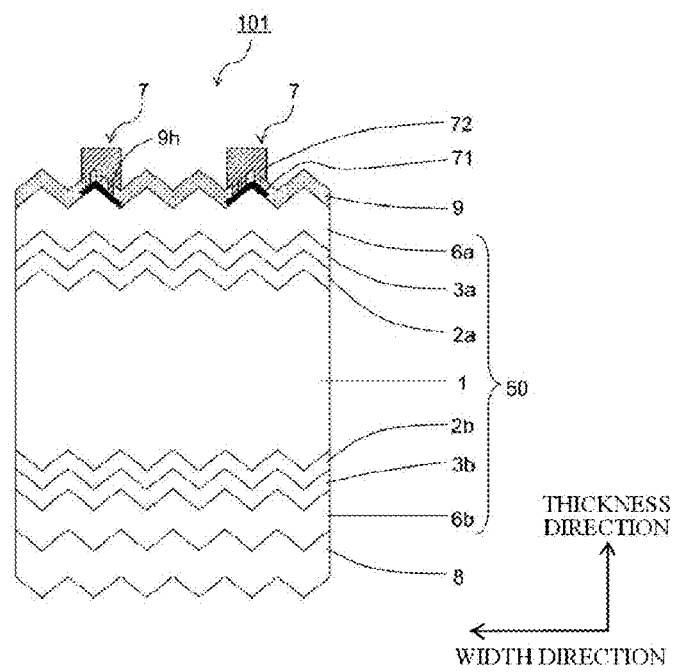
FIG. 2 is a schematic sectional view showing a heterojunction solar cell according to one embodiment.

FIG. 2 is a schematic sectional view of a heterojunction solar cell according to one embodiment of the present invention. A heterojunction solar cell 101 includes, as a photoelectric conversion section 50, a conductive silicon-based thin-film 3a and a light-receiving side transparent electrode layer 6a in this order on one surface (light-receiving surface) of a single-crystalline silicon substrate 1 of a first conductivity type. A conductive silicon-based thin-film 3b and a back side transparent electrode layer 6b are preferably provided in this order on the other surface (surface opposite to the light-receiving surface) of the single-crystalline silicon substrate 1 of the first conductivity type. A collecting electrode 7 including a first electroconductive layer 71 and a second electroconductive layer 72 is formed on the light-receiving side transparent electrode layer 6a of the surface of the photoelectric conversion section 50. An insulating layer 9 having openings is formed between the first electroconductive layer 71 and the second electroconductive layer 72.

Intrinsic silicon-based thin-films 2a and 2b are preferably provided between the single-crystalline silicon substrate 1 of the first conductivity type and the conductive silicon-based thin-films 3a and 3b. A back side metal electrode 8 is preferably provided on the back side transparent electrode layer 6b.

[Configuration of Photoelectric Conversion Section]

First, the single-crystalline silicon substrate of the first conductivity type in the heterojunction solar cell will be described. Generally, the single-crystalline silicon substrate contains impurities that supply charges to silicon for imparting conductivity. The single-crystalline silicon substrate is classified as an n-type which contains atoms for introducing electrons into silicon atoms (e.g. phosphorus) or a p-type which contains atoms for introducing holes into silicon atoms (e.g. boron). That is, the "first conductivity type" in the present invention means one of the n-type and the p-type.

In a heterojunction solar cell, electron/hole pairs can be efficiently separated and collected by setting a reverse junction as a heterojunction on the incident side at which light incident to the single-crystalline silicon substrate is absorbed most, thereby providing a strong electric field. Therefore, the heterojunction on the light-receiving side is preferably a reverse junction. When holes and electrons are compared, electrons, which are smaller in effective mass and scattering cross section, are generally larger in mobility. Accordingly, it is preferred that the single-crystalline silicon substrate of the first conductivity type used in a heterojunction solar cell is an n-type single-crystalline silicon substrate. In order to enhance a light confinement, the single-crystalline silicon substrate of the first conductivity type preferably has textured structure in its surface.

A silicon-based thin-film is formed on the surface of the single-crystalline silicon substrate of the first conductivity type on which a textured structure is formed. The method for forming these silicon-based thin-films is preferably a plasma-enhanced chemical vapor deposition (CVD) method. Conditions of the plasma-enhanced CVD method for forming the silicon-based thin-films are preferably as follows: a substrate temperature of 100 to 300° C., a pressure of 20 to 2600 Pa, and a high-frequency power density of 0.004 to 0.8 W/cm2. A source gas used to form the silicon-based thin-films may be a silicon-based gas such as $SiH_4$ or $Si_2H_6$, or a mixed gas of silicon-based gas and $H_2$.

The conductive silicon-based thin-films 3a and 3b are silicon-based thin-films of the first conductivity type or opposite conductivity type. For example, when an n-type is used as the single-crystalline silicon substrate 1 of the first conductivity type, the silicon-based thin-film of the first conductivity type and the silicon-based thin-film of the opposite conductivity type are n- and p-types, respectively. A dopant gas for forming the p-type or the n-type silicon-based thin-film is preferably, for example, $B_2H_6$ or $PH_3$. The amount of impurity such as P or B added is sufficient to be a trace amount; thus, it is preferred to use a mixed gas diluted with $SiH_4$ or $H_2$ beforehand. When a gas containing a different element, such as $CH_4$, $CO_2$, $NH_3$ or $GeH_4$, is added thereto in formation of the conductive silicon-based thin-film, silicon is alloyed so that the energy gaps of the conductive silicon-based thin-films can be changed.

Examples of the silicon-based thin-film include an amorphous silicon thin-film and microcrystalline silicon (a thin-film including amorphous silicon and crystalline silicon). Among them, an amorphous silicon-based thin-film is preferably used. When an n-type single-crystalline silicon substrate is used as the single-crystalline silicon substrate 1 of the first conductivity type, examples of the preferred structure of the photoelectric conversion section 50 include a stacked structure in the order of: transparent electrode layer 6a/p-type amorphous silicon-based thin-film 3a/i-type amorphous silicon-based thin-film 2a/n-type single-crystalline silicon substrate 1/i-type amorphous silicon-based thin-film 2b/n-type amorphous silicon-based thin-film 3b/transparent electrode layer 6b. In this case, for the aforementioned reason, the light-receiving surface is preferably on the p layer side.

The intrinsic silicon-based thin-films 2a and 2b are preferably i-type hydrogenated amorphous silicon composed of silicon and hydrogen. When i-type hydrogenated amorphous silicon is formed on a single-crystalline silicon substrate by a CVD method, surface passivation can be effectively performed while suppressing diffusion of impurities to the single-crystalline silicon substrate. When the amount of hydrogen in the film is changed along the thickness direction, the layer may have an energy gap profile effective for collecting carriers.

The p-type silicon-based thin-film is preferably a p-type hydrogenated amorphous silicon layer, a p-type amorphous silicon carbide layer or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable in the sense that the optical loss can be reduced.

The photoelectric conversion section 50 of the heterojunction solar cell 101 preferably includes transparent electrode layers 6a and 6b on the conductive silicon-based thin-films 3a and 3b. The transparent electrode layers 6a and 6b preferably have a conductive oxide as a main component. As the conductive oxide, for example, zinc oxide, indium oxide and tin oxide may be used alone or in mixtures thereof. From the viewpoints of electroconductivity, optical characteristics and long-term reliability, indium-based oxides including indium oxide are preferable. Among them, those having indium tin oxide (ITO) as a main component are more suitably used.

Here, the wording "as a main component" in this specification means that the content is more than 50% by weight, preferably 70% by weight or more, more preferably 90% by weight or more. The transparent electrode layer may be a single layer or a layered structure composed of multiple layers.

A dopant can be added to the transparent electrode layer. For example, when zinc oxide is used for the transparent electrode layer, examples of the dopant include aluminum, gallium, boron, silicon and carbon. When indium oxide is used for the transparent electrode layer, examples of the dopant include zinc, tin, titanium, tungsten, molybdenum and silicon. When tin oxide is used for the transparent electrode layer, examples of the dopant include fluorine.

The dopant can be added to one or both of the light-receiving side transparent electrode layer 6a and the back side transparent electrode layer 6b. In particular, the dopant is preferably added to the light-receiving side transparent electrode layer 6a. By adding the dopant to the light-receiving side transparent electrode layer 6a, the transparent electrode layer itself is made less resistive, and the resistance loss between the transparent electrode layer 6a and the collecting electrode 7 can be suppressed.

The thickness of the light-receiving side transparent electrode layer 6a is preferably set to 10 nm or more and 140 nm or less, from the viewpoints of transparency, electroconductivity and reduction of light reflection. The role of the transparent electrode layer 6a is to transport carriers to the collecting electrode 7, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited. A physical vapor deposition method such as a sputtering method, a chemical vapor deposition method utilizing a reaction of an organic metal compound with oxygen or water (MOCVD), or the like is preferable. In any formation method, energy from heat or plasma discharge may be utilized.

The substrate temperature during the formation of the transparent electrode layer may appropriately set. For example, when an amorphous silicon-based thin-film is used as a silicon-based thin-film, the substrate temperature is preferably 200° C. or lower. By ensuring that the substrate temperature is 200° C. or lower, desorption of hydrogen from the amorphous silicon layer and associated generation of a dangling bond to a silicon atom can be suppressed, and as a result, conversion efficiency can be improved.

A back side metal electrode 8 is preferably formed on the back side transparent electrode layer 6b. For the back side metal electrode 8, it is desirable to use a material having a high reflectivity in a near-infrared to infrared range, and having high electroconductivity and chemical stability. Examples of the material satisfying these characteristics include silver and aluminum. The method for forming a back side metal electrode layer is not particularly limited, and a physical vapor deposition method such as a sputtering method or a vacuum vapor deposition method, a printing method such as screen printing, or the like is applicable.

[Collecting Electrode]

The collecting electrode 7 is formed on the transparent electrode layer 6a. The collecting electrode 7 is a finger electrode extending along predetermined direction on the photoelectric conversion section, and includes a first electroconductive layer 71 and a second electroconductive layer 72. The first electroconductive layer 71 preferably includes a low-melting-point material having a thermal-fluidization onset temperature $T_1$ that is lower than the heat-resistant temperature of the photoelectric conversion section.

In this embodiment, the insulating layer 9 having openings is formed between the first electroconductive layer 71 and the second electroconductive layer 72. A part of the second electroconductive layer 72 is conductively connected with the first electroconductive layer 71. Here, the wording "a part of . . . is conductively connected with . . ." typically refers to a state in which a conductive connection is established by forming openings in the insulating layer and filling the openings with a material of the second electroconductive layer; a state is also included in which a part of the insulating layer has very small thickness, i.e. only several nanometers thick (in other words, a region with small thickness is locally formed), and resultantly the second electroconductive layer 72 is conductively connected with the first electroconductive layer 71. For example, when the low-melting-point material of the first electroconductive layer 71 is a metallic material such as aluminum, mention is made of a state in which a conductive connection is established between the first electroconductive layer 71 and the second electroconductive layer via an oxide covering (corresponding to the insulating layer) formed on the surface of the first electroconductive layer.

In the present invention, the insulating layer 9 is formed so as to cover the first electroconductive layer 71. Openings are formed in the insulating layer on the first electroconductive layer, and the openings of the insulating layer are unevenly distributed to the central portion on the first electroconductive layer. The central portion $L_c$ on the first electroconductive layer is a region sandwiched between regions (non-central portions $L_o$) within the range of $d_2-d_I$ from both ends of the first electroconductive layer, respectively, in a direction orthogonal to the extending direction of the first electroconductive layer. Specifically, as shown in FIGS. 5(C1) and 5(C2), boundaries $b_{AN}$ and $b_{BN}$ between the central portion and the non-central portions exist on a straight line $A_N$ passing through points $s_N$ included in the set of points $s_N$ positioned at fixed intervals in the extending direction of the first electroconductive layer: $S=\{s_1, s_2, \ldots, s_u\}$ (N=1, 2, . . . , u). A region sandwiched between a line $O_A$ formed by connecting points included in the set of $b_{AN}$: $B_A=\{b_{A1}, b_{A2}, \ldots, b_{Au}\}$ (N=1, 2, . . . , u) and a line $O_B$ formed by connecting points included in the set of $b_{BN}$: $B_B=\{b_{B1}, b_{B2}, \ldots, b_{Bu}\}$ (N=1, 2, . . . , u) is the central portion. The non-central portion $L_o$ on the first electroconductive layer refers to regions on the first electroconductive layer other than the central portion, i.e. regions within the range of $d_2-d_I$ from both ends of the first electroconductive layer, respectively, in a direction orthogonal to the extending direction of the first electroconductive layer. $d_2$ denotes a thickness of the second electroconductive layer, and $d_I$ denotes a thickness of the insulating layer.

The phrase "unevenly distributed to the central portion" means that the density at the central portion is higher than the density at the non-central portions. For example, the phrase "openings of the insulating layer formed on the first electroconductive layer are unevenly distributed to the central portion" means that the density $S_c$ of openings of the insulating layer at the central portion is higher than the density $S_o$ of openings of the insulating layer at the non-central portion, i.e. the relationship of $S_o<S_c$ is satisfied. The phrase "the low-melting-point material contained in the first electroconductive layer is unevenly distributed to the central portion" as described later means that the density $M_c$ of the low-melting-point material at the central portion is higher than the density $M_o$ of the low-melting-point material at the non-central portion.

(Method for measuring density of opening section)

A method for measuring a density of openings of the insulating layer at the central portion and the non-central portion on the first electroconductive layer will be described below. The density of openings of the insulating layer is determined by the steps of: (i) measuring the thickness $d_1$ of the insulating layer and the thickness $d_2$ of the second electroconductive layer; (ii) identifying the central portion and the non-central portion of the first electroconductive layer; and (iii) measuring the density of openings of the insulating layer. In FIG. 5E, the region B is a region where the density of openings of the insulating layer is measured. By observing the region A and the region C that are adjacent to the region B, the central portion and the non-central portion of the first electroconductive layer are identified.

Figure 9A:
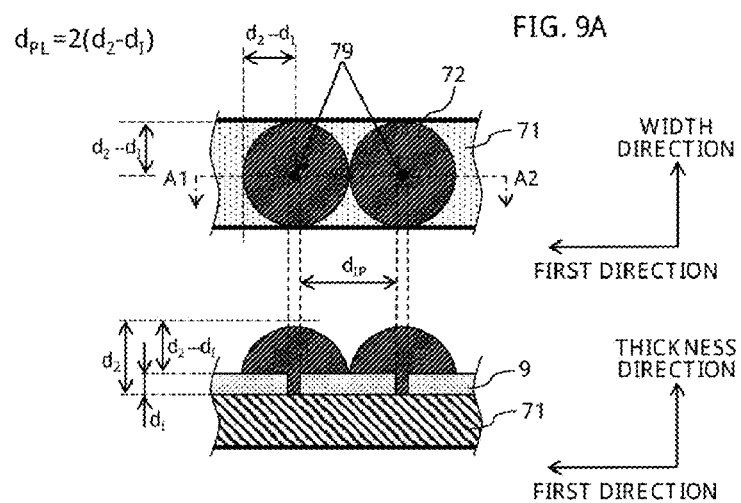
FIG. 9A is a conceptual view for explaining a relationship among a distance between adjacent opening sections and an electrical contact between adjacent second electroconductive layers.
Figure 9B:
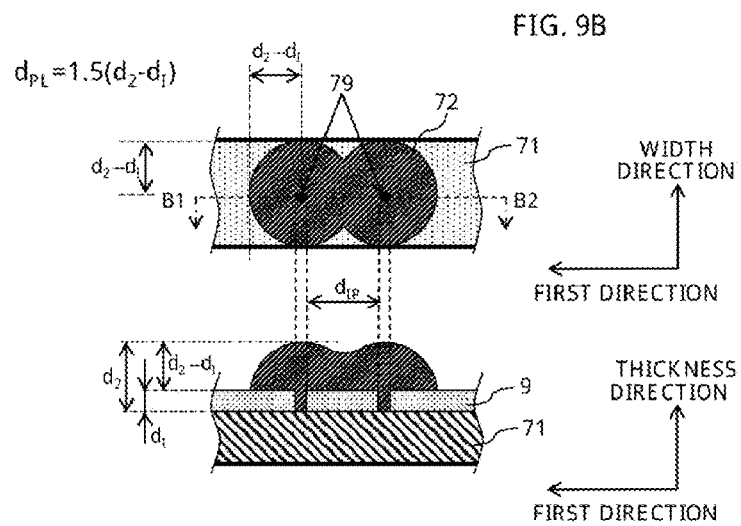
FIG. 9B is a conceptual view for explaining a relationship among a distance between adjacent opening sections and an electrical contact between adjacent second electroconductive layers.

(i) Measurement of Thickness $d_I$ of Insulating Layer and Thickness $d_2$ of Second Electroconductive Layer First, the thickness $d_I$ of the insulating layer and the thickness $d_2$ of the second electroconductive layer are measured in the vicinity of a region where the density of openings of the insulating layer is measured. As shown in FIGS. 9A and 9B, the thickness $d_I$ of the insulating layer 9 is a distance between an interface on the first electroconductive layer 71 side and an interface on the second electroconductive layer 72 side of the insulating layer 9. The thickness $d_2$ of the second electroconductive layer 72 is a distance between a surface of the first electroconductive layer 71 exposed to opening sections of the insulating layer 9 and a surface of the second electroconductive layer 72. When the two surfaces are nonparallel to each other, the length of the foot of a perpendicular line drawn from an interface between the first electroconductive layer and the insulating layer (or an interface between the first electroconductive layer and the opening section of the insulating layer) is defined as a face-to-face distance (thickness). When the thickness of the insulating layer or the second electroconductive layer is uneven, an average of thicknesses measured at a plurality of spots may be defined as $d_I$ or $d_2$.

(ii) Identification of Central Portion and Non-Central Portions on First Electroconductive Layer By observing the surface of the first electroconductive layer, the central portion and the non-central portions of the first electroconductive layer are identified. The region X is a region adjacent to the measured region, and in FIG. 5E, each of the region A and the region C corresponds to the region X. For example, the region X is a region having a length of about 0.5 mm along the extending direction of the first electroconductive layer (direction shown by the arrow in FIGS. 5A and 5B. The central portion $L_c$ is a region sandwiched between two lines formed by sequentially connecting boundary points between the central portion and the non-central portions in the region X on the first electroconductive layer. The non-central portions $L_o$ are regions other than the central portion of the first electroconductive layer.

A method for identifying the central portion and the non-central portions of the first electroconductive layer on the insulating layer will be described with reference to FIGS. 5A to 5E. When the second electroconductive layer is formed on the first electroconductive layer, it is difficult to directly observe the surface of the first electroconductive layer, and therefore the second electroconductive layer on a region close to a region where the thickness of the second electroconductive layer is measured is selectively removed, so that the surface of the first electroconductive layer can be observed. The method for removing the second electroconductive layer is not particularly limited. It is preferred to remove the second electroconductive layer by a method that does not cause a change in shape of the first electroconductive layer, such as chemical etching, peeling with use of a pressure-sensitive adhesive tape, or mechanical polishing. When the insulating layer is non-transparent, the insulating layer in addition to the second electroconductive layer is removed for observing the surface of the first electroconductive layer.

Figure 5A:
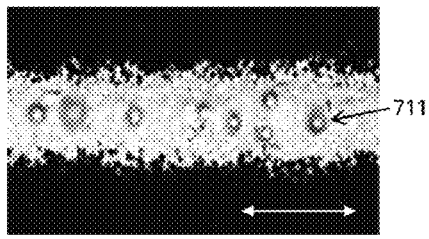
FIGS. 5A, 5B, 5C, 5D, and 5E are conceptual views for explaining a method for specifying a central portion and a non-central portion on a first electroconductive layer, and a method for measuring a density of opening sections.
Figure 5B:
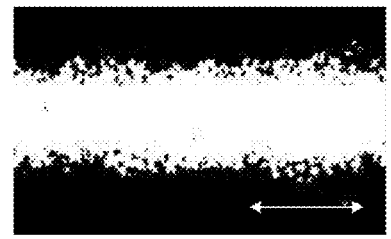

FIG. 5A is a photomicrograph of the first electroconductive layer after the second electroconductive layer is removed by chemical etching. First, both ends $E_{1A}$ and $E_{1B}$ of the first electroconductive layer in the width direction at one end of the region X are extracted. By using a binarized image of an observation image (e.g. a photograph taken under an optical microscope or a scanning electron microscope) (FIG. 5B, an end of the first electroconductive layer in the width direction, i.e. a boundary between a first electroconductive layer-formed region and a first electroconductive layer-non-formed region can be easily extracted.

A threshold in binarization processing may be appropriately set on the basis of an external appearance image. The both ends $E_{1A}$ and $E_{1B}$ are, respectively, a point ($E_{1A}$) at which the brightness changes from 0 to 1 and a point ($E_{1B}$) at which the brightness changes from 1 to 0 when the intensity of the brightness of a binarized image is scanned along a straight line $A_1$ which passes through a point $S_1$ and is orthogonal to the extending direction of the first electroconductive layer. The distance between $E_{1A}$ and $E_{1B}$ determined in this manner is $L_1$, and the middle point between $E_{1A}$ and $E_{1B}$ is $C_1$.

Figure 5C:
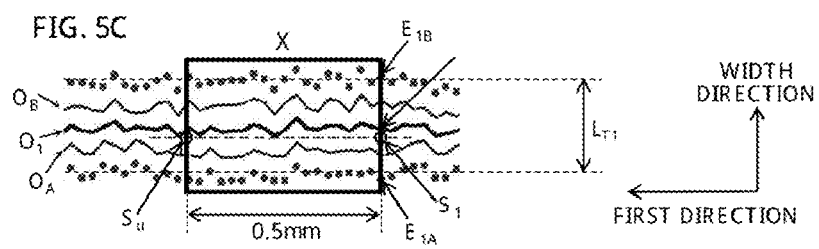
Figure 5D:
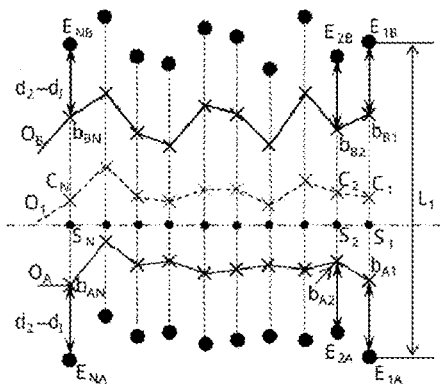
Figure 5E:
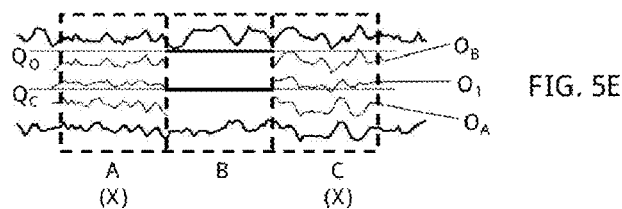

FIG. 5C is a view for explaining a method for determining boundary lines ($O_A$ and $O_B$) between the central portion and the non-central portions of the first electroconductive layer from a binarized image, and FIG. 5D is a partially enlarged view of the region X. For each of points $S_N$ (N=1, 2, 3, . . . , u) existing at fixed intervals on a straight line which passes through the point $S_1$ and is parallel to the extending direction of the first electroconductive layer, points $E_{NA}$ and $E_{NB}$ at both ends of the first electroconductive layer in the width direction, and a middle point $C_N$ are extracted. $E_{NA}$ and $E_{NB}$ and the middle point $C_N$ therebetween can be extracted by scanning the intensity of the brightness of the image along the straight line $A_N$ which passes through the point $S_N$ and is orthogonal to the extending direction of the first electroconductive layer as described above. The line formed by connecting middle points $C_N$ is a center line $O_1$ of the first electroconductive layer. The line width $L_N$ of the first electroconductive layer at the point $S_N$ is a distance between $E_{NA}$ and $E_{NB}$, and the average of $L_N$ (N=1, 2, 3, . . . , u) is $L_{T1}$.

The points at which the distance along the straight line $L_N$ from each of the point $E_{NA}$ and the point $E_{NB}$ is $(d_2-d_I)$ (points at which the distance from $C_N$ is $L_N/2-(d_2-d_I)$ on the straight line $A_N$) are, respectively, boundaries $b_{AN}$ and $b_{BN}$ between the central portion and the non-central portions. The line formed by connecting points included in the set of boundaries $b_{AN}$ on the point $E_{NA}$ side: $B_A=\{b_{A1}, b_{A2}, b_{A3}, \ldots, b_{Au}\}$ (N=1, 2, 3, . . . , u) is a boundary line $O_A$ between the central portion and the non-central portion. The line formed by connecting points included in the set of boundaries $b_{BN}$ on the point $E_{NB}$ side: $B_B=\{b_{B1}, b_{B2}, b_{B3}, \ldots, b_{Bu}\}$ (N=1, 2, 3, . . . , u) is a boundary line $O_B$ between the central portion and the non-central portion. The region sandwiched between the two boundary lines $O_A$ and $O_B$ is a central portion $L_c$ on the first electroconductive layer.

Here, $d_2$: thickness of second electroconductive layer;

$d_I$: thickness of insulating layer;

$A_N$: straight line which passes through point $S_N$ and is orthogonal to the extending direction of the first electroconductive layer;

$E_{NA}$, $E_{NB}$: intersection between $A_N$ and each of both ends of first electroconductive layer;

$L_N$: distance between $E_{NA}$ and $E_{NB}$ (line width of first electroconductive layer at $S_N$);

$L_{T1}$: average of $L_N$ (N=1, 2, . . . , u);

$C_N$: middle point between $E_{NA}$ and $E_{NB}$;

$b_{AN}$ and $b_{BN}$: points at which the distance from $C_N$ is $L_N/2-(d_2-d_I)$ on the straight line $A_N$ (where the point on the $E_{NA}$ side is $b_{AN}$ and the point on the $E_{NB}$ side is $b_{BN}$);

$O_1$: line formed by connecting $C_N$ (N=1, 2, . . . , u) in ascending order from N=1 (also referred to as "center line");

$O_A$: line formed by connecting $b_{AN}$ (N=1, 2, . . . , u) in ascending order from N=1; and $O_B$: line formed by connecting $b_{BN}$ (N=1, 2, . . . , u) in ascending order from N=1.

When $d_I$ is sufficiently smaller than $d_2$ (e.g. $d_2 \geq 50 d_I$), the central portion and the non-central portions may be identified with $d_2-d_I$ considered equal to $d_2$.

(iii) Measurement of Density of Openings of Insulating Layer

Finally, a density of openings of the insulating layer is determined. How to determine a density of openings of the insulating layer at the "central portion" will be described. First, a cross section of the measured region (region B) is formed along a straight line Qc passing through the central portion of the first electroconductive layer at regions A and C. As described in FIG. 5E, the straight line Qc passes through the vicinity of the center line of the region A and the vicinity of the center line of the region C, and is substantially parallel to the extending direction of the first electroconductive layer. The method for forming a cross section is not particularly limited. As a known method, a method in which a sample embedded in a resin is cut, and the cut surface is subjected to a polishing treatment to form a cross section, or a method in which processing is performed using a focused ion beam (FIB) is applicable. A cross section image of the second electroconductive layer can be observed with an optical microscope or a scanning electron microscope.

From the observation of the cross section, a total of lengths of regions provided with openings of the insulating layer: $H_L$ $(=H_1+H_2+\ldots H_n)$ and a length $L_X$ of a measured region are each calculated (see FIG. 6), and a ratio of the former to the latter: $H_L/L_X$ is defined as a density $S_C$ of openings in the insulating layer at the central portion on the first electroconductive layer. The length $L_X$ of the measured region is preferably the overall width of the region B, and is set to about 0.5 mm.

Subsequently, the density of openings of the insulating layer at the "non-central portion" of the first electroconductive layer is evaluated. Similarly to the measurement of the density of openings of the insulating layer at the central portion on the first electroconductive layer, a cross section of the measured region (region B) is formed along a straight line $Q_o$ passing through the non-central portion of the first electroconductive layer at regions A and C, the cross section is observed with a scanning electron microscope or the like, a length of openings of the insulating layer and a length of the measured region are calculated, and a ratio therebetween is defined as a density $S_o$ of openings in the insulating layer at the non-central portion on the first electroconductive layer. As shown in FIG. 5E, the straight line $Q_o$ passes through the vicinity of the center of non-central portion of the region A (center between the boundary line $O_B$ and the end of the first electroconductive layer), and the vicinity of the center of the non-central portion of the region C, and is substantially parallel to the extending direction of the first electroconductive layer. The first electroconductive layer has a non-central portion at each of both ends thereof, and generally the densities of openings of the insulating layer at these two non-central portions are comparable to each other. Therefore, the density of openings of the insulating layer at any one of the non-central portions may be defined as a density of openings at the non-central portion of the measured region.

In each of a plurality of measured regions of the collecting electrode, the above-mentioned steps (i) to (iii) are performed to calculate a density $S_C$ of openings at the central portion and a density $S_O$ of openings at the non-central portion in each measured region. For example, the above-mentioned measurement is performed in each of ten measured regions, and an average of densities of openings of the insulating layer in the measured regions is defined as a density of openings of the insulating layer.

(Reduction of Shading Area by Collecting Electrode)

Figure 3A:
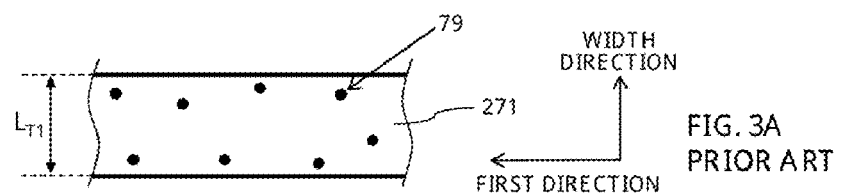
FIGS. 3A and 3B are conceptual views showing a structure of a collecting electrode in a related art.
Figure 3B:
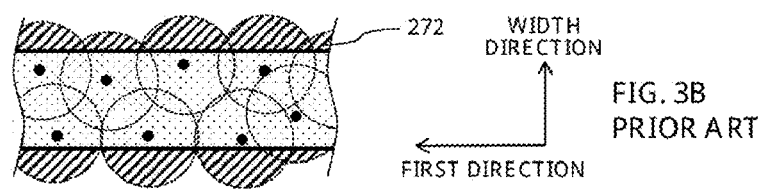

Shading by the collecting electrode will be described below with reference to FIGS. 3A, 3B, 3C, and 3D. Generally, in a plating method, a metal is isotropically grown centering on an origination point at which the metal is generated. Therefore, when openings of the insulating layer (plating origination points 79) are evenly formed on a first electroconductive layer 271 as shown in FIG. 3A, the metal is also grown from the vicinity of an end of the first electroconductive layer, and as shown in FIG. 3B, a second electroconductive layer 272 is grown so as to protrude from a region where the first electroconductive layer 271 is formed (hatching region in FIG. 3B. Thus, the second electroconductive layer 272 is also grown on a region where the first electroconductive layer 271 is not formed (first electroconductive layer-non-formed region), and therefore the width of the second electroconductive layer 272 tends to become larger than the width of the first electroconductive layer 271. That is, as compared to a case where only the first electroconductive layer is formed, the shading area by the collecting electrode more easily increases, thus causing a decrease in current (Jsc) in the solar cell.

Figure 3C:
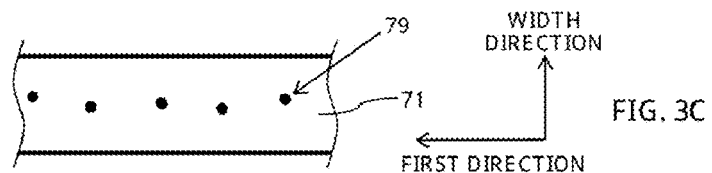
FIGS. 3C and 3D are conceptual views showing a structure of a collecting electrode.

The shading area can also be reduced by reducing the line width of the first electroconductive layer. However, the contact resistance between the first electroconductive layer and the transparent electrode layer also varies depending on a contact area between the former and the latter, and therefore when the line width (area) of the first electroconductive layer is reduced, deterioration of performance of the solar cell due to an increase in contact resistance may be no longer ignored. On the other hand, in the present invention, openings of the insulating layer (plating origination points 79) are arranged so as to be unevenly distributed to the central portion on the first electroconductive layer 71 as shown in FIG. 3C, and the second electroconductive layer 72 is formed by the plating method with openings of the insulating layer as origination points as shown in FIG. 3D.

Figure 3D:
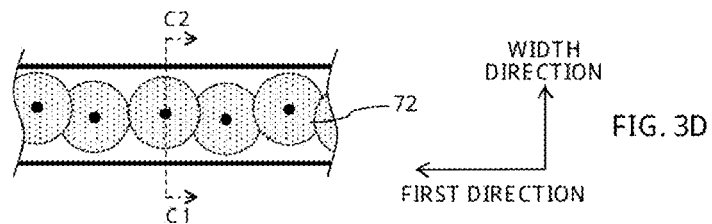
Figure 3E:
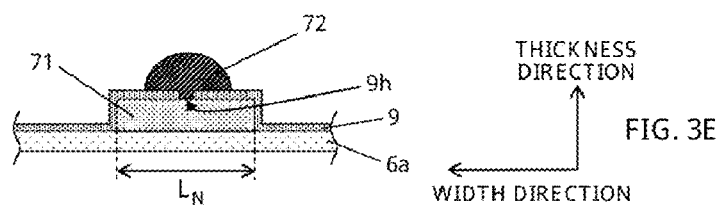
FIG. 3E is a schematic sectional view showing a structure of a collecting electrode.

FIG. 3E is a schematic view showing a cross section of the collecting electrode taken along the line C1-C2 in FIG. 3D. In the solar cell of the present invention, openings 9h of the insulating layer 9, which serve as origination points for deposition of the second electroconductive layer 72, are unevenly distributed to the central portion on the first electroconductive layer 71 as shown in 3E. Therefore, the second electroconductive layer is hard to protrude from the top of the first electroconductive layer, so that the contact resistance in a finger electrode can be reduced without increasing the shading area by the second electroconductive layer.

For suppressing an increase in shading area by the second electroconductive layer, the density of openings of the insulating layer at the non-central portion on the first electroconductive layer is preferably lower than the density of openings of the insulating layer at the central portion on the first electroconductive layer. Particularly, it is preferred that openings of the insulating layer are not formed at the non-central portion on the first electroconductive layer.

(Formation Method of Openings in Insulating Layer)

The method for forming in the insulating layer 9 openings conductively connecting the first electroconductive layer and the second electroconductive layer with each other is not particularly limited, and a method such as laser irradiation, mechanical drilling or chemical etching may be employed. In one embodiment, a method is used in which a low-melting-point material in the first electroconductive layer is thermally fluidized to form openings in an insulating layer formed thereon.

Examples of the method for forming openings by thermal-fluidization of a low-melting-point material in the first electroconductive layer include a method in which the insulating layer 9 is formed on the first electroconductive layer 71 containing a low-melting-point material, and heating (annealing) is carried out to a temperature equal to or higher than a thermal-fluidization onset temperature $T_1$ of the low-melting-point material to change the surface shape of the first electroconductive layer, so that openings (cracks) are formed in the insulating layer 9 formed on the first electroconductive layer; and a method in which when the insulating layer 9 is formed on the first electroconductive layer 71 containing a low-melting-point material, heating is carried out to a temperature equal to or higher than $T_1$ to thermally fluidize the low-melting-point material, so that openings are formed simultaneously with formation of the insulating layer.

A method for forming openings in the insulating layer using thermal-fluidization of a low-melting-point material in the first electroconductive layer will be described below with reference to the drawings.

Figure 4:
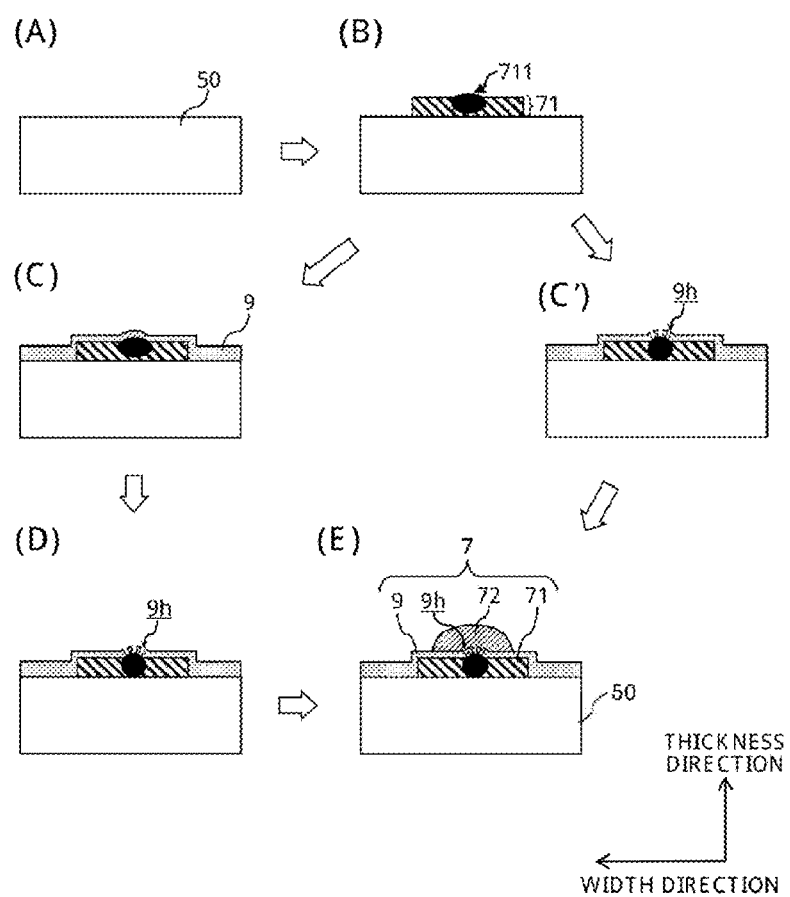
FIG. 4 is a conceptual view of a production process of a solar cell according to one embodiment of the present invention.

FIG. 4 is a schematic procedural view showing one embodiment of a method for forming a collecting electrode 7 on a photoelectric conversion section 50 of a solar cell. In this embodiment, first, the photoelectric conversion section 50 is provided (a photoelectric conversion section providing step; FIG. 4 at (A)). For example, in the case of a heterojunction solar cell, a photoelectric conversion section including a silicon-based thin-film and a transparent electrode layer is provided on a silicon substrate of a first conductivity type, as described above.

A first electroconductive layer 71 containing a low-melting-point material 711 is formed on the first principal surface of the photoelectric conversion section (a first electroconductive layer forming step; FIG. 4 at (B)). Preferably, the first electroconductive layer 71 is formed such that the low-melting-point material 711 is unevenly distributed therein.

An insulating layer 9 is formed on the first electroconductive layer 71 (an insulating layer forming step; FIG. 4 at (C)). The insulating layer 9 may be formed only on the first electroconductive layer 71, or may be formed also on a region on which no first electroconductive layer 71 is formed (first electroconductive layer-non-formed region) in the photoelectric conversion section 50. In particular, when a transparent electrode layer is formed on the surface of the photoelectric conversion section 50 as in the heterojunction solar cell, the insulating layer 9 is preferably formed also on the first electroconductive layer-non-formed region.

After the insulating layer is formed, annealing treatment is carried out by heating (an annealing step; FIG. 4 at.(D)). By the annealing treatment, the first electroconductive layer 71 is heated to an annealing temperature Ta, so that the low-melting-point material 711 is thermally fluidized to thereby change the surface shape of the first electroconductive layer 71, and accordingly the insulating layer 9 formed on the first electroconductive layer 71 is deformed. Typically, deformation of the insulating layer 9 results in formation of openings 9h in the insulating layer. The openings 9h are formed in the form of, for example, cracks. When the low-melting-point material 711 is unevenly distributed to the central portion of the first electroconductive layer 71, the openings in the insulating layer are formed so as to be unevenly distributed to the central portion on the first electroconductive layer by the annealing treatment.

After the openings are formed in the insulating layer by the annealing treatment, a second electroconductive layer 72 is formed by a plating method (a plating step; FIG. 4 at (E)). The first electroconductive layer 71 is covered with the insulating layer 9, but in a section, where the openings 9h are formed in the insulating layer 9, the first electroconductive layer 71 is exposed. Therefore, the first electroconductive layer is exposed to plating solution, so that metal can be deposited at the openings 9h as origination points. According to this method, a second electroconductive layer matching the shape of the collecting electrode can be formed by a plating method without providing a resist material layer having an opening matching the shape of the collecting electrode. In other words, the second electroconductive layer is formed by the plating method with openings of the insulating layer, which are unevenly distributed to the central portion on the first electroconductive layer, as origination points, and therefore an increase in line width of the second electroconductive layer can be suppressed.

(First Electroconductive Layer)

The first electroconductive layer 71 is a layer that functions as an electroconductive underlying layer when the second electroconductive layer is formed by a plating method. Therefore, it suffices that the first electroconductive layer has such a level of electroconductivity that it can function as an underlying layer for electroplating. In this specification, those having a volume resistivity of $10^{-2}$ Ω·cm or less are defined as being electroconductive. Those having a volume resistivity of $10^2$ Ω·cm or more are defined as insulating.

The thickness of the first electroconductive layer 71 is preferably 20 μm or less, more preferably 10 μm or less, in terms of costs. On the other hand, the thickness is preferably 0.5 μm or more, more preferably 1 μm or more, so that the line resistance of the first electroconductive layer 71 falls within a desired range.

The first electroconductive layer 71 preferably contains a low-melting-point material having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally fluidized at a temperature lower than the melting point. In these materials, the thermal-fluidization onset temperature can be defined as being equal to a softening point. The softening point is a temperature at which the viscosity is $4.5 \times 10^6$ Pa·s (same as the definition for the softening point of glass).

Since the first electroconductive layer 71 contains a low-melting-point material, openings can be formed in the insulating layer on a region where a low-melting-point material exists, and the second electroconductive layer can be deposited by plating with the openings as origination points.

Figure 6:
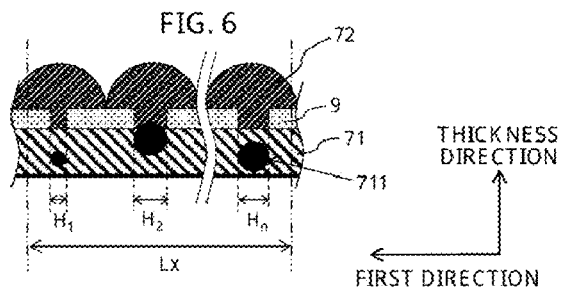
FIG. 6 is a conceptual view for explaining a method for measuring a density of a low-melting-point material in the first electroconductive layer.

In this case, the low-melting-point material is unevenly distributed to the central portion of the first electroconductive layer, so that openings of the insulating layer can be easily formed at the central portion on the first electroconductive layer. As shown in FIG. 6, openings are formed in the insulating layer 9 on the low-melting-point material 711. For reducing the line width of the second electroconductive layer, it is preferred that the density of the low-melting-point material at the non-central portion of the first electroconductive layer is lower than that at the central portion of the first electroconductive layer, and it is more preferred that the low-melting-point material does not exist at the non-central portion of the first electroconductive layer.

By observing a distribution of the low-melting-point material in the first electroconductive layer, a distribution (density) of openings of the insulating layer can be estimated. The distribution of the low-melting-point material can be evaluated by observing the surface of the first electroconductive layer. The density of the low-melting-point material can be determined by dividing an area, which is occupied by the low-melting-point material in a predetermined observation region, by an area of the observation region.

When surface observation is performed, the area occupied by the low-melting-point material can be measured using an optical microscope or a scanning electron microscope.

When it is difficult to distinguish the low-melting-point material from a material other than the low-melting-point material by observation of the external appearance, the area occupied by the low-melting-point material can be measured by, for example, mapping measurement of composition of the first electroconductive layer. Composition analysis can be performed by detecting a characteristic X-ray generated by application of an electron ray, etc., and spectrally dispersing the ray. For example, by scanning an electron ray application position, a spatial distribution of the composition can be measured.

Where the density of the low-melting-point material at the central portion of the first electroconductive layer is defined as $M_C$, and the density of the low-melting-point material at the non-central portion is defined as $M_O$, $M_O/M_C$ is preferably less than 1 (i.e. the low-melting-point material is unevenly distributed to the central portion) for providing a high-efficiency solar cell. $M_O/M_C$ is more preferably 0.5 or less, further preferably 0.2 or less. As $M_O/M_C$ decreases, the degree with which the low-melting-point material is unevenly distributed to the central portion increases, and accordingly openings are formed so as to be easily unevenly distributed to the central portion of the insulating layer on the first electroconductive layer (i.e. $S_O/S_C$ decreases), so that a high-efficiency solar cell is obtained.

Examples of the method for forming the first electroconductive layer such that the low-melting-point material is unevenly distributed to the central portion of the layer include a method in which the first electroconductive layer is made to have a two-layer structure including a first electrode pattern layer that does not contain the low-melting-point material, and a second electrode pattern layer that has a line width smaller than that of the first electrode pattern and contains the low-melting-point material. At this time, it is preferred to form the second electrode pattern layer so as to be positioned at the central portion on the first electrode pattern layer.

When the first electroconductive layer is pattern-formed using a coating material composed of a particulate low-melting-point material, a particulate high-melting-point material, a resin and so on as described later, the low-melting-point material can also be unevenly distributed to the central portion of the first electroconductive layer by controlling the particle size and content of each of the low-melting-point material and the high-melting-point material, and the viscosity of the coating material.

Figure 7:
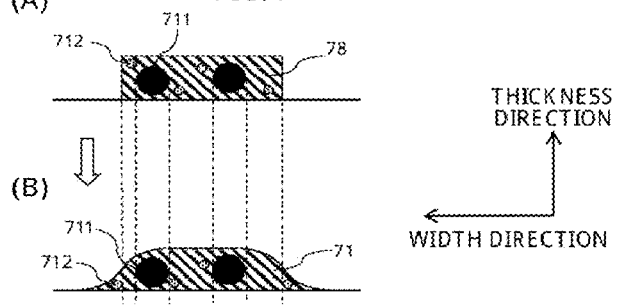
FIG. 7 is a sectional view schematically showing a state in which the shape of a print coating layer is changed as fluidization occurs with the elapse of time during formation of the first electroconductive layer.

When the first electroconductive layer contains the high-melting-point material in addition to the low-melting-point material, the particle size of the low-melting-point material is preferably larger than the particle size of the high-melting-point material. For example, when the first electroconductive layer is formed in a pattern shape by a screen printing method, fluidization occurs to change the shape of a print-coating layer 78 with an elapse of time as shown in FIG. 7 because the coating material has viscosity. When the particle size of the low-melting-point material 711 is larger than the particle size of the high-melting-point material 712 at this time, the high-melting-point material having a small particle size is more easily fluidized, so that the high-melting-point material 712 is preferentially moved to the end of the first electroconductive layer 71. As a result, the low-melting-point material 711 is left at the central portion of the first electroconductive layer 71, so that the low-melting-point material 711 can be unevenly distributed to the central portion of the first electroconductive layer 71.

From such a point of view, the viscosity of the coating material that forms the first electroconductive layer is preferably 10 to 500 Pa·s, more preferably 50 to 300 Pa·s. When the viscosity of the coating material falls within the above-mentioned range, fluidization of the low-melting-point material having a large particle size is hard to occur, and fluidization of the high-melting-point material or the like easily occurs, so that the low-melting-point material is easily unevenly distributed to the central portion of the first electroconductive layer as shown in FIG. 7 at (B). The viscosity of the coating material can be measured under conditions of a temperature of 25° C. and a rotation speed of 10 rpm using a rotational viscometer (B-type viscometer) manufactured by Brookfield Ltd.

The low-melting-point material is preferably thermally fluidized in the annealing treatment, thus causing a change in surface shape of the first electroconductive layer 71. Therefore, the thermal-fluidization onset temperature $T_1$ of the low-melting-point material is preferably lower than an annealing temperature Ta. In the present invention, the annealing treatment is preferably carried out at the annealing temperature Ta that is lower than the heat-resistant temperature of the photoelectric conversion section 50. Therefore, the thermal-fluidization onset temperature $T_1$ of the low-melting-point material is preferably lower than the heat-resistant temperature of the photoelectric conversion section.

The heat-resistant temperature of the photoelectric conversion section is a temperature at which characteristics of a solar cell (also referred to as a "cell") including the photoelectric conversion section or a solar cell module prepared using a cell are irreversibly reduced. For example, in the heterojunction solar cell 101 shown in FIG. 2, the single-crystalline silicon substrate 1 that forms the photoelectric conversion section 50 hardly undergoes a change in characteristics even when heated to a high temperature of 500° C. or higher. In contrast, the transparent electrode layers 6a and 6b and amorphous silicon-based thin-films 2a, 2b, 3a, and 3b may undergo thermal degradation or diffusion of dope impurities when heated to about 250° C., thus causing an irreversible reduction in the solar cell characteristics. Therefore, in the heterojunction solar cell, the first electroconductive layer 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally fluidized in the step of forming the first electroconductive layer, so that an amount of surface shape change of the first electroconductive layer in the annealing treatment is increased to form the openings 9h in the insulating layer 9 easily. For example, when the first electroconductive layer is formed by coating or printing, heating may be carried out for drying. In this case, the thermal-fluidization onset temperature $T_1$ of the low-melting-point material is preferably higher than the temperature of heating for drying the first electroconductive layer. Accordingly, the thermal-fluidization onset temperature $T_1$ of the low-melting-point material is preferably 80° C. or higher, more preferably 100° C. or higher.

The low-melting-point material may be an organic substance or an inorganic substance as long as the thermal-fluidization onset temperature $T_1$ falls within the aforementioned range. The low-melting-point material may be electroconductive or insulating, but is desired to be a metallic material that has electroconductivity. If the low-melting-point material is a metallic material, the resistance value of the first electroconductive layer can be decreased, so that uniformity of the thickness of the second electroconductive layer can be improved when the second electroconductive layer is formed by electroplating. If the low-melting-point material is a metallic material, the contact resistance between the photoelectric conversion section 50 and the collecting electrode 7 can also be reduced.

As the low-melting-point material, a low-melting-point metallic material alone or an alloy thereof, or a mixture of a plurality of low-melting metallic materials can be suitably used. Examples of the low-melting-point metallic material include indium, bismuth, and gallium.

The first electroconductive layer 71 preferably contains, in addition to the aforementioned low-melting-point material, high-melting-point material having thermal-fluidization onset temperature $T_2$ that is relatively higher than the thermal-fluidization onset temperature of the low-melting-point material. When the first electroconductive layer 71 includes a high-melting-point material, a conductive connection can be efficiently established between the first electroconductive layer and the second electroconductive layer, so that conversion efficiency of the solar cell can be improved. For example, when a material with high surface energy is used as the low-melting-point material, the first electroconductive layer 71 is exposed to a high temperature in the annealing treatment, the low-melting-point material is thereby brought into liquid phase state and as a result, particles of the low-melting-point material aggregate into coarse particles, so that disconnecting occurs in the first electroconductive layer 71 in some cases. In contrast, the high-melting-point material is not brought into a liquid phase state by heating in the annealing treatment, and therefore by including the high-melting-point material in the first electroconductive layer forming material, disconnecting of the first electroconductive layer by coarsening of the low-melting-point material can be suppressed.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-melting-point material and the annealing temperature Ta in the annealing treatment preferably satisfy $T_1<Ta<T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-melting-point material, for example, a metallic material alone such as silver, aluminum, or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, ease of forming openings in the insulating layer (increase of the number of origination points for metal deposition on the second electroconductive layer), and so on. The optimum value of the content ratio varies depending on combinations of materials and particle sizes used. For example, the weight ratio between the low-melting-point material and the high-melting-point material (low-melting-point material:high-melting-point material) is set in a range of 5:95 to 67:33. The weight ratio between the low-melting-point material and the high-melting-point material is more preferably set to from 10:90 to 50:50, further preferably set to from 15:85 to 35:65.

When a particulate low-melting-point material such as metal particles is used as a material of the first electroconductive layer 71, the particle size $D_L$ of the low-melting-point material is preferably no less than 1/20, more preferably no less than 1/10, of the thickness d of the first electroconductive layer, so that a formation of openings in the insulating layer in the annealing treatment is facilitated. The particle size $D_L$ of the low-melting-point material is preferably 0.25 μm or more, more preferably 0.5 μm or more. When the first electroconductive layer 71 is formed by a printing method such as screen printing, the particle size of particles can be appropriately set according to, for example, the mesh size of a screen plate. For example, the particle size is preferably smaller than the mesh size, more preferably no more than 1/2 of the mesh size. When particles are non-spherical, the particle size is defined by the diameter of a circle having an area equal to the projected area of particles (projected area-circle equivalent diameter, Heywood diameter).

The shape of particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before carrying out the annealing treatment is non-spherical, the amount of change in surface shape of the first electroconductive layer is larger because particles become more spherical when heated to the thermal-fluidization onset temperature $T_1$ or higher in the annealing treatment. Therefore, it becomes easy to form openings in the insulating layer 9 on the first electroconductive layer 71.

As described previously, the first electroconductive layer 71 shows electroconductivity, and it suffices that its volume resistivity is $10^{-2}$ Ω·cm or less. The volume resistivity of the first electroconductive layer 71 is preferably $10^{-4}$ Ω·cm or less. When the first electroconductive layer has only the low-melting-point material, it suffices that the low-melting-point material has electroconductivity. When the first electroconductive layer contains the low-melting-point material and the high-melting-point material, it suffices that at least either one of the low-melting-point material and the high-melting-point material has electroconductivity. Examples of the combination of the low-melting-point material/high-melting-point material include: insulating material/electroconductive material; electroconductive material/insulating material; and electroconductive material/electroconductive material. In order to make the first electroconductive layer less resistive, it is preferable that both the low-melting-point material and high-melting-point material be electroconductive materials.

For the material forming the first electroconductive layer, a paste or the like containing a binder resin or the like can be suitably used, besides the aforementioned low-melting-point material (and the high-melting-point material). For sufficiently improving the electroconductivity of the first electroconductive layer formed by a screen printing method, it is desirable to cure the first electroconductive layer by a heat treatment. Therefore, for the binder resin contained in the paste, a material that can be cured at the aforementioned drying temperature is preferably used, and an epoxy-based resin, a phenol-based resin, an acrylic resin and the like are applicable. This is because in this case, the shape of the low-melting-point material is changed as it is cured, and as shown in FIG. 4 at (D), openings (cracks) are easily generated in the insulating layer near the low-melting-point material in the annealing treatment. It suffices that the ratio between the binder resin and the electroconductive low-melting-point material is set so as to be equal to or more than the so-called percolation threshold (a critical value of a ratio corresponding to the low-melting-point material content at which electroconductivity is exhibited).

The first electroconductive layer 71 can be prepared by a known technique such as an inkjet method, a screen printing method, a conductor wire bonding method, a spray method, a vacuum deposition method, or a sputtering method. The first electroconductive layer 71 is preferably patterned in a specific shape such as a comb-like pattern. For formation of the patterned first electroconductive layer, the screen printing method is suitable to increase productivity. For the screen printing method, a method is suitably used in which a collecting electrode pattern is printed using a printing paste containing a low-melting-point material made of metal particles and a screen plate having an opening pattern matching the pattern shape of the collecting electrode.

On the other hand, when a material containing a solvent is used as the printing paste, a drying step for removing the solvent is required. As described previously, the drying temperature in this case is preferably lower than the thermal-fluidization onset temperature $T_1$ of the low-melting-point material. The drying time can be appropriately set at, for example, about 5 minutes to 1 hour.

The first electroconductive layer may be composed of a plurality of layers. The first electroconductive layer may have, for example, a layered structure composed of a lower layer having a low contact resistance with a transparent electrode layer on the surface of a photoelectric conversion section and an upper layer containing a low-melting-point material. According to this structure, it can be expected that the fill factor of the solar cell is improved as contact resistance with the transparent electrode layer decreases. It can be expected that the first electroconductive layer is made still less resistive by forming a layered structure of a layer with low-melting-point material and a layer with high-melting-point material.

Explanations have been provided above principally for the case of forming the first electroconductive layer by a printing method, but the method for forming the first electroconductive layer is not limited to the printing method. For example, the first electroconductive layer may be formed by a deposition method or a sputtering method using a mask matching the pattern shape.

(Insulating Layer)

An insulating layer 9 is formed on the first electroconductive layer 71. Here, when the first electroconductive layer 71 is formed in a specific pattern (e.g. a comb-like pattern), the surface of the photoelectric conversion section 50 has a first electroconductive layer-formed region where the first electroconductive layer is formed, and a first electroconductive layer-non-formed region where no first electroconductive layer is formed. The insulating layer 9 is formed at least on the first electroconductive layer-formed region. In the present invention, the insulating layer 9 is preferably formed on the first electroconductive layer-non-formed region as well, and is especially preferably formed on the entire surface of the first electroconductive layer-non-formed region. When the insulating layer is also formed on the first electroconductive layer-non-formed region, the photoelectric conversion section can be chemically and electrically protected from a plating solution when the second electroconductive layer is formed by a plating method. For example, when a transparent electrode layer is formed on the surface of the photoelectric conversion section 50 as in a heterojunction solar cell, by formation of the insulating layer on the surface of the transparent electrode layer, contact of the transparent electrode layer with a plating solution is suppressed, so that deposition of a metallic layer (second electroconductive layer) onto the transparent electrode layer can be prevented. The insulating layer is more preferably formed on the entire first electroconductive layer-formed region and first electroconductive layer-non-formed region to increase productivity.

In the present invention, the insulating layer having openings is formed to cover the first electroconductive layer. The openings in the insulating layer are formed so as to be unevenly distributed to the central portion on the first electroconductive layer. As described above, for suppressing an increase in shading area by the second electroconductive layer, it is preferred that the density of openings of the insulating layer is lower at the non-central portion on the first electroconductive layer than at the central portion on the first electroconductive layer, and it is more preferred that openings of the insulating layer are not formed at the non-central portion on the first electroconductive layer.

As the material of the insulating layer 9, a material that is electrically insulating is used. It is desirable that the insulating layer 9 be a material having chemical stability to a plating solution. By using a material having high chemical stability to a plating solution, the insulating layer is hardly dissolved in a plating step during formation of the second electroconductive layer, so that damage to the surface of the photoelectric conversion section is hindered. When the insulating layer 9 is formed on the first electroconductive layer-non-formed region as well, the insulating layer preferably has high adhesive strength with the photoelectric conversion section 50. For example, in the heterojunction solar cell, the insulating layer 9 preferably has high adhesive strength with the transparent electrode layer 6a on the surface of the photoelectric conversion section 50. By increasing adhesive strength between the transparent electrode layer and the insulating layer, the insulating layer becomes hard to peel off during the plating step, so that deposition of a metal onto the transparent electrode layer can be prevented.

For the insulating layer 9, a material having low optical absorption is preferably used. The insulating layer 9 is formed on the light-receiving side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer after forming the second electroconductive layer. Consequently, the process for manufacturing the solar cell can be simplified, so that productivity can be further improved. When a solar cell is provided for a practical use without removing the insulating layer 9, it is desirable that a material having sufficient weather resistance and stability to heat/humidity in addition to transparency is used for forming the insulating layer 9.

The material of the insulating layer may be an inorganic insulating material or an organic insulating material. As the inorganic insulating material, a material such as silicon oxide, silicon nitride, titanium oxide, aluminum oxide, magnesium oxide, or zinc oxide can be used. As the organic insulating material, a material such as polyester, an ethylene-vinyl acetate copolymer, acrylic, epoxy, or polyurethane can be used. The material of the insulating layer is preferably an inorganic material having a low elongation at break, so that a formation of openings in the insulating layer, which occurs as the surface shape of the first electroconductive layer changes by stress or the like at the interface, in the annealing treatment is facilitated. Among these inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate, or the like is suitably used from the viewpoints of resistance to a plating solution and transparency of the material. Above all, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, or the like is preferable from the viewpoints of electrical characteristics, adhesiveness with the transparent electrode layer, and so on, and silicon oxide, silicon nitride, or the like is especially suitably used to adjust the refractive index appropriately. These inorganic materials are not limited to those having a stoichiometric composition, but may be those having oxygen-deficiencies.

The thickness of the insulating layer 9 may be set appropriately, according to the material of the insulating layer and method of formation thereof. The thickness of the insulating layer 9 is preferably so thin that openings may be formed in the insulating layer by stress or the like at the interface, which occurs as the surface shape of the first electroconductive layer is changed in the annealing treatment. Accordingly, the thickness of the insulating layer 9 is preferably 1000 nm or less, more preferably 500 nm or less. By appropriately setting the optical characteristics and thickness of the insulating layer 9 in a first electroconductive layer-non-formed region, light reflection characteristics are improved, and the amount of light introduced into the solar cell is increased, so that conversion efficiency can be further improved. For obtaining this effect, the refractive index of the insulating layer 9 is preferably lower than the refractive index of the surface of the photoelectric conversion section 50. In order to impart suitable anti-reflection characteristics to the insulating layer 9, the thickness is preferably set within a range of 30 nm to 250 nm, and more preferably set within a range of 50 nm to 250 nm. The thickness of the insulating layer on the first electroconductive layer-formed region and the thickness of the insulating layer on the first electroconductive layer-non-formed region may be mutually different. For example, the thickness of the insulating layer may be set so as to facilitate a formation of openings in the annealing treatment as to the first electroconductive layer-formed region, and the thickness of the insulating layer may be set so as to have an optical thickness with appropriate anti-reflection characteristics as to the first electroconductive layer-non-formed region.

When a transparent electrode layer (the refractive index of which is generally about 1.9 to 2.1) is provided on the photoelectric conversion section 50 as in the heterojunction solar cell, the refractive index of the insulating layer is preferably an intermediate value between the refractive index of air (1.0) and the refractive index of the transparent electrode layer to enhance an anti-reflection effect at the interfaces thereby increasing an amount of light introduced into the solar cell. When the solar cells are sealed to be modularized, the refractive index of the insulating layer is preferably an intermediate value between the refractive index of a sealing material and the refractive index of the transparent electrode layer. Accordingly, the refractive index of the insulating layer 9 is, for example, preferably 1.4 to 1.9, more preferably 1.5 to 1.8, further preferably 1.55 to 1.75. The refractive index of the insulating layer can be adjusted to fall within a desired range according to the material, composition, and the like of the insulating layer. For example, in the case of silicon oxide, the refractive index is increased by decreasing the oxygen content. Unless otherwise specified, the refractive index in this specification is a refractive index to light having a wavelength of 550 nm and a value measured by spectroscopic ellipsometry. The optical thickness (refractive index×thickness) of the insulating layer is preferably set according to the refractive index of the insulating layer so that antireflection characteristics are improved.

The insulating layer can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed.

Above all, the insulating layer 9 is preferably formed by the plasma-enhanced CVD method so as to form a film having a more densified structure. By this method, a film having a structure with high density can be formed even when an insulating layer having a small thickness of ca. 30 to 100 nm, as well as when an insulating layer with a large thickness of about 200 nm, is formed.

For example, when the photoelectric conversion section 50 has on its surface a textured structure (uneven structure) as in the solar cell shown in FIG. 2, the insulating layer is preferably formed by the plasma-enhanced CVD method so that a densified film may be formed even at recessed and raised portions of the texture. By using an insulating layer having high density, damage to the transparent electrode layer during a plating treatment can be reduced, and also deposition of a metal onto the transparent electrode layer can be prevented. Thus, the insulating layer having high density can function as a barrier layer to water, oxygen, and the like for a layer within the photoelectric conversion section 50, like the silicon-based thin-film 3 in the heterojunction solar cell in FIG. 2, so that an effect of improving long-term reliability of the solar cell can also be expected.

The shape of the insulating layer 9 present between the first electroconductive layer 71 and the second electroconductive layer 72, i.e. the insulating layer 9 on the first electroconductive layer-formed region does not necessarily have to be a seamless layer, but may be an island layer. The term "island" in this specification means a state in which a non-formed region, on which no insulating layer 9 is formed, is provided at a part of the surface.

The insulating layer 9 can also contribute to improvement of adhesive strength between the first electroconductive layer 71 and the second electroconductive layer 72. For example, when a Cu layer is formed on an Ag layer as an under-layer electrode by a plating method, adhesive strength between the Ag layer and the Cu layer is low, but it can be expected that the adhesive strength of the second electroconductive layer is increased to improve the reliability of the solar cell as a result of formation of the Cu layer on an insulating layer of silicon oxide or the like.

As described above, the annealing treatment is carried out after the insulating layer is formed on the first electroconductive layer 71 and before the second electroconductive layer 72 is formed. In the annealing treatment, the first electroconductive layer 71 is heated to a temperature higher than the thermal-fluidization onset temperature $T_1$ of the low-melting-point material, and the low-melting-point material is fluidized, so that the surface shape of the first electroconductive layer is changed. In association with this change, the openings 9h are formed in the insulating layer 9 on the first electroconductive layer (FIG. 4 at (D)). Therefore, in the subsequent plating step, a part of the surface of the first electroconductive layer 71 is exposed to a plating solution for conducting electricity, thus making it possible to deposit a metal on the conducting part as origination point as shown in FIG. 4 at (E).

In this case, the openings are formed principally on the low-melting-point material 711 of the first electroconductive layer 71. When the low-melting-point material is an insulating material, a part immediately below the opening is insulating, but a plating solution is also penetrated into the electroconductive high-melting-point material present on the periphery of the low-melting-point material, and therefore a conductive connection can be established between the first electroconductive layer and the plating solution.

The annealing temperature (heating temperature) Ta in the annealing treatment is preferably higher than the thermal-fluidization onset temperature $T_1$ of the low-melting-point material, i.e. $T_1<Ta$. The annealing temperature Ta more preferably satisfies $T_1+1°$ C.$\leq Ta\leq T_1+100°$ C., and further preferably satisfies $T_1+5°$ C.$\leq Ta\leq T_1+60°$ C. The annealing temperature can be appropriately set according to the composition and content of the material of the first electroconductive layer, and so on.

The annealing temperature Ta is preferably lower than the heat-resistant temperature of the photoelectric conversion section 50 as described above. The heat-resistant temperature of the photoelectric conversion section varies depending on the configuration of the photoelectric conversion section. For example, when a transparent electrode layer and an amorphous silicon-based thin-film are provided as in the heterojunction solar cell or the silicon-based thin-film solar cell, the heat-resistant temperature is about 250° C. Thus, in the case of the heterojunction solar cell or the silicon-based thin-film solar cell, in which the photoelectric conversion section includes an amorphous silicon-based thin-film, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower.

In association therewith, the thermal-fluidization onset temperature $T_1$ of the low-melting-point material of the first electroconductive layer 71 is preferably lower than 250° C., more preferably lower than 200° C., further preferably lower than 180° C. On the other hand, a crystalline silicon solar cell having a diffusion layer of an opposite conductivity type on a first principal surface of a crystalline silicon substrate of a first conductivity type has neither an amorphous silicon thin-film nor a transparent electrode layer, and therefore shows a heat-resistant temperature of about 800° C. to 900° C. Thus, the annealing treatment may be carried out at an annealing temperature Ta higher than 250° C.

The method for forming openings in an insulating layer is not limited to a method in which an annealing treatment is performed after formation of an insulating layer as described above. For example, the openings 9h can be formed almost simultaneously with the formation of the insulating layer 9, as shown in FIG. 4 at (C').

For example, when the insulating layer is formed while the substrate is heated, openings are formed almost simultaneously with formation of the insulating layer. Here, the term "almost simultaneously with formation of the insulating layer" means a state in which a step other than the insulating layer forming step, such as an annealing treatment, is not performed. In other words, "almost simultaneously with formation of the insulating layer" means a state during or immediately after formation of the insulating layer. The term "immediately after formation" also includes a duration until the substrate is cooled to room temperature, etc., after formation of the insulating layer is completed (after heating is stopped). Formation of openings in the insulating layer on the low-melting-point material also includes a situation in which even after formation of the insulating layer on the low-melting-point material is completed, the insulating layer on the periphery of the low-melting-point material is deformed as the insulating layer is formed on the periphery thereof, so that openings are formed.

As a method for forming openings almost simultaneously with formation of the insulating layer, for example, a method is used in which the insulating layer 9 is formed on the first electroconductive layer 71 while the substrate is heated to a temperature Tb higher than the thermal-fluidization onset temperature $T_1$ of a low-melting-point material 711 of the first electroconductive layer 71 in the insulating layer forming step. Since the insulating layer 9 is formed on the first electroconductive layer with the low-melting-point material in a fluidized state, stress is generated at a deposition interface concurrently with deposition, so that, openings, like cracks, for example, are formed in the insulating layer. The substrate temperature Tb during formation of the insulating layer (hereinafter, referred to as an "insulating layer formation temperature") refers to a substrate surface temperature at the start of formation of the insulating layer (also referred to as a "substrate heating temperature"). Generally, the mean value of the substrate surface temperature during the formation of the insulating layer is equal to or higher than the substrate surface temperature at the start of deposition. Therefore, when the insulating layer formation temperature Tb is higher than the thermal-fluidization onset temperature $T_1$ of the low-melting-point material, a deformed portion such as openings can be formed in the insulating layer.

For example, when the insulating layer 9 is formed by a dry method such as a CVD method or a sputtering method, openings can be formed by ensuring that the substrate surface temperature during formation of the insulating layer is higher than the thermal-fluidization onset temperature $T_1$ of the low-melting-point material. When the insulating layer 9 is formed by a wet method such as coating, openings can be formed by ensuring that the substrate surface temperature at the time of drying a solvent is higher than the thermal-fluidization onset temperature $T_1$ of the low-melting-point material. The "deposition starting time point" when the insulating layer is formed by a wet method refers to a time point at which drying of a solvent is started. A preferred range of the insulating layer formation temperature Tb is similar to the preferred range of the annealing temperature Ta.

For example, the substrate surface temperature can be measured with a temperature indication material (so called thermo label or thermo seal) or a thermocouple attached to the substrate surface on the deposition surface side. The temperature of heating part (e.g. a heater) can be appropriately adjusted so that the surface temperature of the substrate falls within a predetermined range. When an annealing treatment is performed in the insulating layer forming step, openings can be formed in the insulating layer by appropriately adjusting the material and composition of the insulating layer and deposition conditions (deposition method, substrate temperature, type and introduction amount of introduced gas, deposition pressure, power density, and the like).

When the insulating layer 9 is formed by a plasma-enhanced CVD method, the insulating layer formation temperature Tb is preferably 130° C. or higher, more preferably 140° C. or higher, further preferably 150° C. or higher for forming a dense film. The maximum achieving temperature of the substrate surface during formation of the insulating layer is preferably lower than the heat-resistant temperature of the photoelectric conversion section.

The deposition speed in plasma-enhanced CVD is preferably 1 nm/second or less, more preferably 0.5 nm/second or less, further preferably 0.25 nm/second or less for forming a denser film. When silicon oxide is formed by plasma-enhanced CVD, the deposition conditions preferably include a substrate temperature of 145° C. to 250° C., a pressure of 30 Pa to 300 Pa and a power density of 0.01 W/cm$^2$ to 0.16 W/cm$^2$.

When openings are formed almost simultaneously with formation of the insulating layer and there are locations where formation of the openings are insufficient, etc., the above-described annealing step may be further performed after the formation of the insulating layer.

As described above, in the method in which the low-melting-point material in the first electroconductive layer is thermally fluidized to form openings in the insulating layer formed on the low-melting-point material, openings are formed in the insulating layer on the low-melting-point material. Therefore, when the first electroconductive layer is formed such that the low-melting-point material is unevenly distributed to the central portion of the first electroconductive layer, openings of the insulating layer are formed so as to be unevenly distributed to the central portion on the first electroconductive layer. As shown in FIG. 6, openings can be formed in the insulating layer on the projected surface in the thickness direction of the low-melting-point material even when the low-melting-point material is not present on the outermost surface of the first electroconductive layer.

In the present invention, openings of the insulating layer are formed so as be unevenly distributed to the central portion on the first electroconductive layer, and therefore the density $S_c$ of openings of the insulating layer at the central portion is higher than the density $S_o$ of openings of the insulating layer at the non-central portion. In other words, the ratio between the density $S_C$ of openings of the insulating layer at the central portion and the density $S_O$ of openings of the insulating layer at the non-central portion: $S_O/S_C$ is less than 1. $S_O/S_C$ is preferably 0.5 or less, further preferably 0.2 or less. As $S_O/S_C$ decreases, the width of the second electroconductive layer can be made smaller even when the thickness $d_I$ of the second electroconductive layer is large. Thus, the width of the collecting current decreases, so that shading by the collecting electrode is reduced, and therefore the amount of power generation of the solar cell can be increased.

The method for unevenly distributing openings of the insulating layer to the central portion on the first electroconductive layer is not limited to a method in which the low-melting-point material in the first electroconductive layer is thermally fluidized. Openings may be formed so as to be unevenly distributed in the insulating layer at the central portion on the first electroconductive layer by, for example, a method such as application of laser light, mechanical drilling or chemical etching.

For reducing the resistance of the second electroconductive layer, the distance $d_{IP}$ between adjacent openings in the insulating layer is preferably small. When a metallic material of the second electroconductive layer deposited from the bottom of one opening (the top of the first electroconductive layer) of the insulating layer on the first electroconductive layer comes into contact with a metallic material deposited from the bottom of an adjacent opening as shown in FIGS. 9A and 9B, the second electroconductive layer with a plurality of openings as origination points is electrically connected to reduce the resistance of the collecting electrode.

The metallic materials of the second electroconductive layer deposited from the bottoms of adjacent openings are electrically connected to each other when the distance $d_{IP}$ between the adjacent openings is equal to or smaller than $2\times(d_2-d_I)$ as shown in FIG. 9A. The region where the second electroconductive layer materials deposited from the bottoms of adjacent openings overlap each other becomes wider as the distance $d_{IP}$ between the adjacent openings decreases as shown in FIG. 9B. Therefore, the ratio of $d_{IP}$ to $d_2-d_I$ is more preferably 1.5 or less (i.e. $d_{IP} \le 1.5\times(d_2-d_I)$).

Figure 8A:
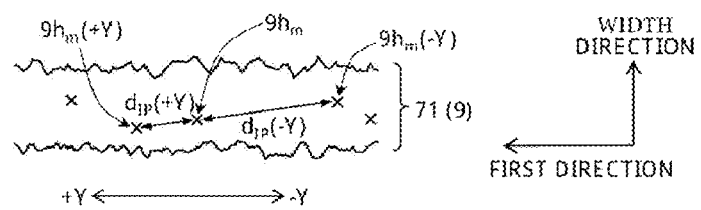
FIG. 8A is a conceptual view for explaining a distance between adjacent opening sections.

As schematically shown in FIG. 8A, the value of larger one of the distances $d_{IP}(+Y)$ and $d_{IP}(-Y)$ is defined as distance $d_{IP}$ between adjacent openings, where the extending direction of the first electroconductive layer is the Y axis direction and wherein $d_{IP}(+Y)$ is a distance between an opening $9h_m$ and an opening $9h_m(+Y)$ adjacent thereto in the +Y direction and $d_{IP}(-Y)$ is a distance between the opening $9h_m$ and an opening adjacent thereto in the −Y direction. In FIG. 8A, the distance $d_{IP}$ between adjacent openings is equal to $d_{IP}(-Y)$ because $d_{IP}(+Y)$ is smaller than $d_{IP}(-Y)$. The ratio of each of $d_{IP}(+Y)$ and $d_{IP}(-Y)$ to $(d_2-d_I)$ is preferably 2 or less, more preferably 1.5 or less.

When the first electroconductive layer contains the low-melting-point material, and the low-melting-point material is formed in an island-like shape, the distance $d_{PL}$ between adjacent low-melting-point materials is preferably $2\times(d_2-d_I)$ or less, more preferably $1.5\times(d_2-d_I)$ or less. When the distance between low-melting-point materials adjacent to each other in the first electroconductive layer is small, the distance $d_{IP}$ between opening sections adjacent to each other in the insulating layer on the low-melting-point material decreases, and therefore the second electroconductive layer with a plurality of openings as origination points is electrically connected to reduce the resistance of the collecting electrode.

Figure 8B:
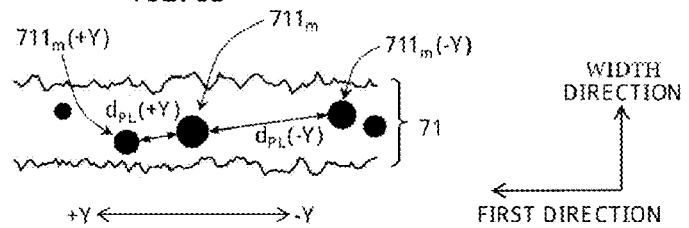
FIG. 8B is a conceptual view for explaining a distance between adjacent low-melting-point materials.

As schematically shown in FIG. 8B, the value of larger one of the distances $d_{PL}(+Y)$ and $d_{PL}(-Y)$ is defined as distance $d_{PL}$ between adjacent low-melting-point materials, wherein $d_{PL}(+Y)$ is a distance between a low-melting-point material $711_m$ provided with the first electroconductive layer and a low-melting-point material $711_m(+Y)$ adjacent thereto in the +Y direction and $d_{PL}(-Y)$ is a distance between the low-melting-point material $711_m$ and a low-melting-point material $711_m(-Y)$ adjacent thereto in the −Y direction. In FIG. 8B, the distance $d_{PL}$ between adjacent low-melting-point materials is equal to $d_{PL}(-Y)$ because $d_{PL}(+Y)$ is smaller than $d_{PL}(-Y)$. The ratio of each of $d_{PL}(+Y)$ and $d_{PL}(-Y)$ to $(d_2-d_f)$ is preferably 2 or less, more preferably 1.5 or less.

The phrase "the low-melting-point material is formed in an island-like shape" means that for example, a particulate low-melting-point material is isolated such that the low-melting-point material is surrounded by materials of the first electroconductive layer other than the low-melting-point material (such as a high-softening-point material and a resin paste). When low-melting-point materials are aggregated, the distance between adjacent low-melting-point materials may be determined with the aggregated low-melting-point materials considered as one island (low-melting-point material).

(Second Electroconductive Layer)

After the insulating layer 9 having the openings 9h is formed as described above, the second electroconductive layer 72 is formed on the insulating layer 9 of the first electroconductive layer-formed region by a plating method. The metal deposited as the second electroconductive layer is not particularly limited as long as it is a material that can be formed by a plating method, and for example, copper, nickel, tin, aluminum, chromium, silver, gold, zinc, lead, palladium, or the like, or a mixture thereof can be used.

The line width $L_2$ of the second electroconductive layer can be set according to the line width $L_{T1}$ of the first electroconductive layer, the thickness $d_2$ of the second electroconductive layer, and the like. When the first electroconductive layer has no insulating layer thereon, or openings of the insulating layer on the first electroconductive layer are formed in the vicinity of the end of the first electroconductive layer, the second electroconductive layer is formed with the end of the first electroconductive layer in the width direction as an origination point. Since the width of the second electroconductive layer formed so as to protrude to the first electroconductive layer-non-formed region is $d_2$ at maximum, the line width of the collecting electrode (line width of the second electroconductive layer) is $L_{T1}+2\times d_2$ at maximum, so that the shading area increases.

On the other hand, in the present invention, openings of the insulating layer are unevenly distributed to the central portion on the first electroconductive layer, and therefore the ratio of the second electroconductive layer formed with the end of the first electroconductive layer as an origination point is low, so that the width of the second electroconductive layer formed so as to protrude onto the first electroconductive layer-non-formed region can be reduced. Thus, the width $L_F$ of the second electroconductive layer can be reduced, and resultantly the line width of the collecting electrode can be reduced.

The line width $L_F$ of the collecting electrode preferably satisfies the relationship of $L_F \leq L_{T1}+d_2$, and more preferably satisfies the relationship of $L_F \leq L_{T1}+0.6\times d_2$. When the relationship of $L_F \leq L_{T1}+d_2$ is satisfied, shading by the second electroconductive layer can be reduced to improve solar cell performance.

Figure 10:
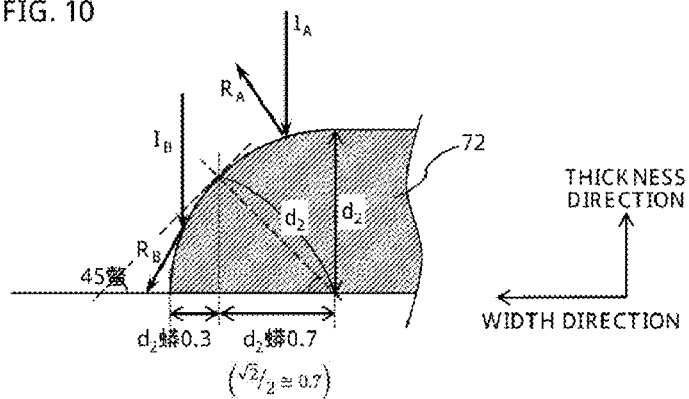
FIG. 10 is a conceptual view showing a state in which light is reflected at a surface of the collecting electrode.

As shown in FIG. 10, within the range of $0.3\times d_2$ from the end of the second electroconductive layer, light $I_B$ in a normal direction of the light-receiving surface is incident to the surface of the collecting electrode at an angel of approximately 45° or more. The light $I_B$ incident to the surface of the collecting electrode at an angle of 45° or more is reflected at the surface of the collecting electrode as reflected light $R_B$, and the reflected light $R_B$ is reflected to the solar cell side, and therefore easily taken in the cell. Thus, even when the second electroconductive layer is formed so as to protrude from the end of the first electroconductive layer-formed region within the range of the width of $0.3\times d_2$, shading by the second electroconductive layer in this region is apt to be substantially negligible. Therefore, even though the second electroconductive layer is formed so as to protrude from the first electroconductive layer-formed region, a decrease in amount of power generation due to shading by the collecting electrode can be suppressed when the widths of the second electroconductive layer protruding from both ends of the first electroconductive layer are each $0.3\times d_2$ or less, i.e. the line width $L_F$ of the collecting electrode satisfies the relationship of $L_F \leq L_{T1}+0.6\times d_2$.

By appropriately adjusting the plating time and the concentration of the plating solution, the thickness $d_2$ of the second electroconductive layer and the line width $L_F$ of the collecting electrode (line width of the second electroconductive layer) can be adjusted. For suppressing an increase in line width of the collecting electrode, and reducing the line resistance, the thickness $d_2$ of the second electroconductive layer is preferably 1 μm or more, more preferably 3 μm or more. The thickness $d_2$ is further preferably 5 μm to 35 μm.

Electric current principally passes through the second electroconductive layer during operation (electricity generation) of the solar cell. Thus, the line resistance of the second electroconductive layer is preferably as low as possible so as to suppress the electric loss caused by resistance in the second electroconductive layer. Specifically, the line resistance of the second electroconductive layer is preferably 1 Ω/cm or less, more preferably 0.5 Ω/cm or less. On the other hand, it suffices that the line resistance of the first electroconductive layer is so low that the layer can function as an underlying layer at the time of electroplating, with an example thereof being 5 Ω/cm or less.

The second electroconductive layer can be formed by either of an electroless plating method and an electroplating method. The electroplating method is suitably used in order to increase productivity. In the electroplating method, the rate of deposition of a metal can be increased, so that the second electroconductive layer can be formed in a short time.

Figure 11:
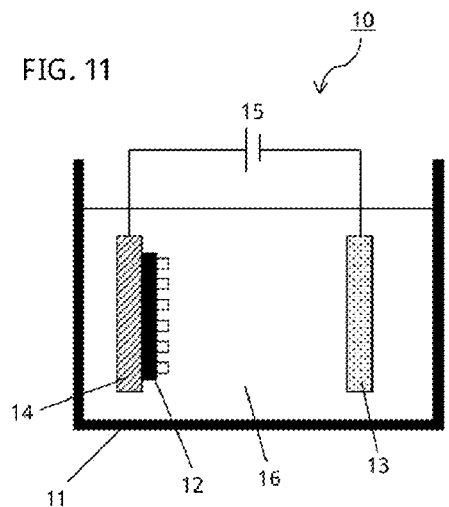
FIG. 11 is a structural schematic view of a plating apparatus.
Figure 12:
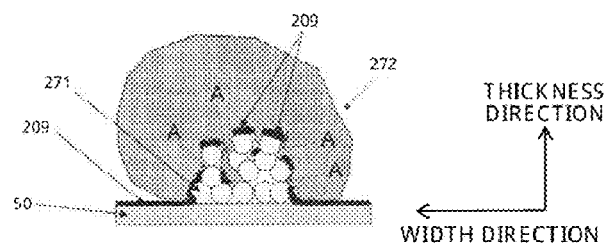
FIG. 12 is a sectional view schematically showing a structure of a collecting electrode in a related art.

A method for forming a second electroconductive layer by the electroplating method will be described taking acidic copper plating as an example. FIG. 11 is a conceptual view of a plating apparatus 10 that is used for forming the second electroconductive layer. A substrate 12 having a first electroconductive layer and an insulating layer having openings on a photoelectric conversion section and an anode 13 are immersed in a plating solution 16 in a plating tank 11. The first electroconductive layer 71 on the substrate 12 is connected to a power source 15 through a substrate holder 14. By applying a voltage between the anode 13 and the substrate 12, copper can be selectively deposited at a part on the first electroconductive layer, which is not covered with the insulating layer 9, i.e. openings generated in the insulating layer by the annealing treatment, as origination points.

The plating solution 16 used for acidic copper plating contains copper ions. For example, a solution of a known composition, which has copper sulfate, sulfuric acid, and water as main components, can be used, and by causing a current of 0.1 to 10 A/dm$^2$ to pass therethrough, a metal as the second electroconductive layer can be deposited. The suitable plating time is appropriately set according to the area of a collecting electrode, the current density, cathode current efficiency, desired thickness, and so on.

In the present invention, a third electroconductive layer may be formed on the second electroconductive layer as the collecting electrode.

For example, by forming a first plating layer (second electroconductive layer) made of a material having a high electroconductivity, such as Cu, on the first electroconductive layer through openings of the insulating layer, and then forming on the second conductive layer a second plating layer (third electroconductive layer) excellent in chemical stability, a collecting electrode having low resistance and being excellent in chemical stability can be formed.

It is preferable that after carrying out the plating step, a plating solution removing step be provided to remove a plating solution remaining on the surface of the substrate 12. By providing the plating solution removing step, a metal that can be deposited at a part, other than at the openings 9h of the insulating layer 9 formed in the annealing treatment, as origination points can be removed.

Examples of the metal deposited at a part other than at the openings 9h as origination points include those deposited at a pinhole in the insulating layer 9 as an origination point. As a result of removing such a metal by the plating solution removing step, the shading area is reduced, so that solar cell characteristics can be further improved.

Here, generally a transparent electrode layer of ITO or the like and an insulating layer of silicon oxide or the like are hydrophilic, and the contact angle of the surface of the substrate 12 or the surface of the insulating layer 9 with water is often about 10° or less. On the other hand, the contact angle of the surface of the substrate 12 with water is preferably 20° or more for facilitating removal of a plating solution by air blowing or the like. For increasing the contact angle at the surface of the substrate, the surface of the substrate 12 may be subjected to a water-repellent treatment. The water-repellent treatment is performed by, for example, forming a water-repellent layer on the surface. By the water-repellent treatment, wettability of the surface of the substrate to a plating solution can be reduced.

In place of the water-repellent treatment of the surface of the insulating layer 9, the insulating layer 9 having water repellency may be formed. That is, by forming the insulating layer 9 having a large contact angle θ (e.g. 20° or more) with water, a special water-repellent treatment step can be omitted, and therefore productivity of the solar cell can be further improved. Examples of the method for imparting water repellency to the insulating layer include a method in which a silicon oxide layer as the insulating layer is formed by a plasma-enhanced CVD method with the conditions for deposition of the insulating layer (e.g. the flow ratio between a silicon raw material gas and an oxygen raw material gas introduced into a deposition chamber) changed.

[Optional Additional Steps after Formation of Collecting Electrode]

In the present invention, an insulating layer removing step may be carried out after forming the collecting electrode (plating step). In particular, when a material having large optical absorption is used as the insulating layer, the insulating layer removing step is preferably carried out for suppressing reduction of solar cell characteristics by the optical absorption of the insulating layer. The method for removing the insulating layer is appropriately selected according to the characteristics of the insulating layer material. For example, the insulating layer can be removed by chemical etching or mechanical polishing. An ashing (incineration) method is also applicable depending on the material. At this time, it is preferable that the insulating layer on the first electroconductive layer-non-formed region is entirely removed, so that an influx of light is further improved. When the water-repellent layer is formed on the insulating layer 9, the water-repellent layer is preferably removed together with the insulating layer 9. When a material having small optical absorption is used as the insulating layer, it is not necessary to carry out the insulating layer removing step.

Explanations have been provided principally for the case of providing the collecting electrode 7 on the light-receiving side of the heterojunction solar cell, but a similar collecting electrode may also be formed on the back side. A solar cell using a crystalline silicon substrate, like the heterojunction solar cell, has a high current value, so that generally the electricity generation loss due to contact resistance between the transparent electrode layer and the collecting electrode tends to be remarkable. In contrast, in the present invention, the collecting electrode having the first electroconductive layer and the second electroconductive layer has low contact resistance with the transparent electrode layer, thus making it possible to reduce the electricity generation loss resulting from contact resistance.

[Example of Application Other than Heterojunction Solar Cell]

The present invention is applicable to various kinds of solar cells such as: crystalline silicon solar cells other than the heterojunction solar cell; solar cells using a semiconductor substrate other than silicon, such as GaAs; silicon-based thin-film solar cells having a transparent electrode layer on a pin junction or a pn junction of an amorphous silicon-based thin-film or a crystalline silicon-based thin-film, compound semiconductor solar cells such as CIS and CIGS; and organic thin-film solar cells, such as dye-sensitized solar cells and organic thin-film (electroconductive polymer).

The crystalline silicon solar cell includes a configuration in which a diffusion layer of an opposite conductivity type (e.g. n-type) is provided on a first principal surface of a crystalline silicon substrate of a first conductivity type (e.g. p-type), and the collecting electrode is provided on the diffusion layer. A crystalline silicon solar cell with this configuration generally includes a conductivity-type layer such as a $p^+$ layer on a back side of the first conductivity-type layer. When the photoelectric conversion section does not include an amorphous silicon layer or a transparent electrode layer, the thermal-fluidization onset temperature $T_1$ of the low-melting-point material and the annealing temperature Ta may be higher than 250° C.

Examples of the silicon-based thin-film solar cell include an amorphous silicon-based thin-film solar cell having an amorphous intrinsic (i-type) silicon thin-film between a p-type thin-film and an n-type thin-film, and a crystalline silicon-based semiconductor solar cell having a crystalline intrinsic silicon thin-film between a p-type thin-film and an n-type thin-film. A tandem-type thin-film solar cell, in which a plurality of pin junctions is stacked, is also suitable. In this silicon-based thin-film solar cell, the thermal-fluidization onset temperature $T_1$ of the low-melting-point material and the annealing temperature Ta are preferably 250° C. or lower, more preferably 200° C. or lower, further preferably 180° C. or lower, in consideration of the heat resistance of the transparent electrode layer and the amorphous silicon-based thin-film.

The solar cell of the present invention is preferably modularized when put into practical use. Modularization of the solar cell is performed by an appropriate method. For example, by connecting a bus bar via an interconnector such as a TAB to a collecting electrode, a plurality of solar cells are connected in series or in parallel, and sealed by a sealing material and a glass plate to thereby perform modularization.

EXAMPLES

The present invention will be more specifically described below by showing examples relating to the heterojunction solar cell shown in FIG. 2, but the present invention is not limited to the Examples below.

Example 1

A heterojunction solar cell of Example 1 was prepared in the following manner.

An n-type single-crystalline silicon wafer having a light incident surface direction identical to the (100) surface and having a thickness of 200 µm was provided as a single-crystalline silicon substrate of a first conductivity type. The silicon wafer was immersed in a 2 wt % aqueous HF solution for 3 minutes to remove a silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water. The surface of the wafer was observed using an atomic force microscope (AFM manufactured by Pacific Nanotechnology, Inc.), and it was confirmed that the surface of the wafer was etched, and a pyramidal texture surface exposed at the (111) plane was formed.

The wafer after etching was introduced into a CVD apparatus, and on the light-receiving side thereof, an i-type amorphous silicon was formed with a thickness of 5 nm as an intrinsic silicon-based thin-film $2a$. Conditions for forming the i-type amorphous silicon included a substrate temperature of 150° C., a pressure of 120 Pa, a $SiH_4/H_2$ flow ratio of 3/10, and a power density supply of 0.011 W/cm². The thickness of the thin-film in this example is a value calculated from a formation rate determined by measuring the thickness of a thin-film formed on a glass substrate under the same conditions using a spectroscopic ellipsometry (trade name: M2000, manufactured by J. A. Woollam Co. Inc.).

On the i-type amorphous silicon layer $2a$, p-type amorphous silicon was formed with a thickness of 7 nm as a silicon-based thin-film $3a$ of an opposite conductivity type. Conditions for forming the p-type amorphous silicon layer $3a$ included a substrate temperature of 150° C., a pressure of 60 Pa, a $SiH_4/B_2H_6$ flow ratio of 1/3, and a power density supply of 0.01 W/cm². The $B_2H_6$ gas flow rate mentioned above is a flow rate of a diluting gas wherein $B_2H_6$ concentration was diluted to 5000 ppm using $H_2$ gas.

Thereafter, on the back side of the wafer, an i-type amorphous silicon layer was formed with a thickness of 6 nm as an intrinsic silicon-based thin-film $2b$. Conditions for forming the i-type amorphous silicon layer $2b$ were the same as those for the aforementioned i-type amorphous silicon layer $2a$. On the i-type amorphous silicon layer $2b$, an n-type amorphous silicon layer was formed with a thickness of 4 nm as a silicon-based thin-film $3b$ of the first conductivity type. Conditions for forming the n-type amorphous silicon layer $3b$ included a substrate temperature of 150° C., a pressure of 60 Pa, a $SiH_4/PH_3$ flow ratio of 1/2, and a power density supply of 0.01 W/cm². The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers $6a$ and $6b$, respectively. The transparent electrode layer was formed by applying a power density of 0.5 W/cm² in an argon atmosphere at a substrate temperature of room temperature and a pressure of 0.2 Pa using indium oxide as a target. On the back side transparent electrode layer $6b$, silver was formed with a thickness of 500 nm as a back side metal electrode $8$ by a sputtering method. A collecting electrode $7$ having a first electroconductive layer $71$ and a second electroconductive layer $72$ was formed on the light-receiving side transparent electrode layer $6a$ in the following manner.

For formation of the first electroconductive layer $71$, an electroconductive material (printing paste) containing SnBi metal powder (particle size $D_L$=20 µm; melting point $T_1$=141° C.) as a low-melting-point material and a silver powder (particle size $D_H$=1 to 3 µm; melting point $T_2$=971° C.) as a high-melting-point material at a weight ratio of 20:80, and further containing an epoxy-based resin as a binder resin was used. The printing paste was screen-printed using a screen plate of #230 mesh (opening width: 1=85 µm) having an opening width (L=80 µm) matching a collecting electrode pattern, and dried at 90° C.

After drying, the surface of the first electroconductive layer was observed within the range of the length of 500 µm along the extending direction of the first electroconductive layer using an optical microscope (LEXT-OLS 3000 manufactured by OLYMPUS CORPORATION), and line widths $L_N$ of the first electroconductive layer were determined at intervals of 20 µm in the extending direction of the first electroconductive layer. The average $L_{T1}$ of the line widths $L_N$ is described in Table 1. The low-melting-point material was unevenly distributed within the region of approximately 40 µm from the center line, i.e. within a region corresponding to opening sections of the screen plate.

The wafer with the first electroconductive layer $71$ formed thereon was introduced into a CVD apparatus, and a silicon oxide layer (refractive index: 1.5) was formed on the light-receiving side with a thickness of 80 nm as an insulating layer $9$ by a plasma-enhanced CVD method.

Conditions for forming the insulating layer $9$ included a substrate temperature of 135° C., a pressure of 133 Pa, a $SiH_4/CO_2$ flow ratio of 1/20, and a power density supply of 0.05 W/cm² (frequency 13.56 MHz). Thereafter, the wafer after formation of the insulating layer was introduced into a circulating hot air oven, and subjected to an annealing treatment at 180° C. for 20 minutes in an air atmosphere (as described later, formation of openings by performing the annealing treatment was confirmed by performing a plating for a short time).

The substrate $12$ subjected to steps up to and including the annealing step as described above was introduced into a plating tank $11$ as shown in FIG. 11. For a plating solution $16$, one obtained by adding additives (product numbers: ESY-2B, ESY-H and ESY-1A, manufactured by C. Uyemura & CO., LTD.) to a solution prepared so that the concentrations of copper sulfate pentahydrate, sulfuric acid, and sodium chloride were 120 g/l, 150 g/l and 70 mg/l, respectively, was used. Using the plating solution, plating was carried out under conditions including a temperature of 40° C. and a current of 3 A/dm². First, plating was performed for a short time, followed by observations with an optical microscope to find that copper was deposited in the vicinity of the low-melting-point material in the first electroconductive layer. It was confirmed therefrom that openings of the insulating layer were formed in the vicinity of the lowmelting-point material in the first electroconductive layer, and plating took place with the openings as origination points. Thereafter, plating was performed for a predetermined time to uniformly deposit copper as the second electroconductive layer 72 with a thickness of about 10 µm on the insulating layer on the first electroconductive layer 71. The line width of the second electroconductive layer was 100 µm, and copper was deposited in the first electroconductive layer-formed region. Little copper was deposited onto a region where no first electroconductive layer was formed.

Thereafter, the silicon wafer on the cell outer periphery was removed in a width of 0.5 mm by a laser processing apparatus to prepare the heterojunction solar cell of the present invention. Measurement result of Characteristics (open circuit voltage (Voc), short circuit current density (Jsc), fill factor (FF), and conversion efficiency (Eff)) of this solar cell is shown in Table 1.

The second electroconductive layer was removed by etching, the surface of the first electroconductive layer was observed with an optical microscope, and a density of the low-melting-point material at each of the central portion and the non-central portion of the first electroconductive layer was calculated based on an area ratio. The cross section of the collecting electrode was observed, and a density of openings at each of the central portion and the non-central portion was calculated based on a length ratio. The results thereof are shown in Table 1. In identification of the central portion and the non-central portion and measurement of the density of the low-melting-point material, an etchant was added dropwise to the second electroconductive layer to etch the second electroconductive layer for a predetermined time, the etchant was then removed, and water washing was performed to remove the second electroconductive layer. In etching, the surface of the second electroconductive layer was masked with a tape, an opening having a width of 1 mm was formed in the tape, and an etchant was added dropwise to the second electroconductive layer exposed to the opening.

Examples 2 to 4

Heterojunction solar cells were prepared in the same manner as in Example 1 except that the plating time during formation of the second electroconductive layer was changed, so that the thickness of the second electroconductive layer was 15, 20 and 30 µm, respectively.

Examples 5 and 6

Heterojunction solar cells were prepared in the same manner as in Example 1 except that the ratio of the low-melting-point metallic material powder to the silver powder (low-melting-point material weight ratio) in the printing paste for formation of the first electroconductive layer 71, the viscosity of the coating material (printing paste) and the thickness of the second electroconductive layer were changed as shown in Table 1. In these examples, the opening width of the screen plate was changed according to the viscosity of the coating material so that the line width $L_{T1}$ of the first electroconductive layer was comparable to that in Example 1.

Comparative Example 1

A heterojunction solar cell was prepared in the same manner as in Example 1 except that as a coating material (printing paste) for formation of the first electroconductive layer, an electrode material paste containing silver fine particles having an average particle size of 0.5 µm, a resin and a solvent was used. The melting point of silver is 961° C., but when silver particles having a small particle size are heated to about 180° C., fusion (necking) of fine particles occurs, so that the particle shape is changed. That is, the silver fine particles in the coating material in Comparative Example 1 act as the "low-melting-point material". Thus, in Comparative Example 1, similarly to the examples described above, openings were formed in the insulating layer by an annealing treatment, and copper was deposited with the openings as origination points in the plating step.

[Evaluation Results]

Preparation conditions (properties of the paste material used for preparation of the first electroconductive layer and the screen opening width) and results of measurements of solar cell characteristics (open circuit voltage (Voc), short circuit current density (Jsc), fill factor (FF), and conversion efficiency (Eff)) for the heterojunction solar cells of the Examples and Comparative Example are shown in Table 1.

The line width $L_{T1}$ of the first electroconductive layer, the width $L_C$ of the central portion of the first electroconductive layer, the distance between low-melting-point materials in the first electroconductive layer, the ratio of the density $M_O$ of the low-melting-point material at the non-central portion to the density $M_C$ of the low-melting-point material at the central portion of the first electroconductive layer ($M_O/M_C$), the thickness $d_2$ of the second electroconductive layer, the line width of the second electroconductive layer, the ratio of the density $S_O$ of openings at the non-central portion to the density $S_C$ of openings at the central portion in the insulating layer on the first electroconductive layer ($S_O/S_C$), and the collecting electrode width (line width of the finger electrode) are collectively shown in Table 1. The collecting electrode width is equal to larger one of the width of the first electroconductive layer and the width of the second electroconductive layer.

TABLE 1

| | Preparation conditions of first electroconductive layer | | | | Collecting electrode First electroconductive layer | | | |
|---|---|---|---|---|---|---|---|---|
| | Viscosity of material (Pa·s) | $D_L$ (µm) | content ratio of low-melting-point material (wt %) | Screen opening width (µm) | $L_{T1}$ (µm) | Width of $L_c$ (µm) | Distance between low-melting-point materials (µm) | $M_o/M_c$ |
| Example 1 | 250 | 25 | 18 | 80 | 110 | 90 | 18 | 0.0 |
| Example 2 | 250 | 25 | 18 | 80 | 110 | 80 | 18 | 0.0 |
| Example 3 | 250 | 25 | 18 | 80 | 110 | 70 | 18 | 0.2 |
| Example 4 | 250 | 25 | 18 | 80 | 110 | 50 | 18 | 0.5 |
| Example 5 | 45 | 25 | 29 | 65 | 110 | 70 | 15 | 0.0 |

TABLE 1-continued

| | | | | | | | | |
|---|---|---|---|---|---|---|---|---|
| Example 6 | 45 | 25 | 18 | 65 | 110 | 70 | 20 | 0.0 |
| Comparative Example 1 | 250 | 0.5 | 100 | 80 | 110 | 70 | — | 1.0 |

| | Collecting electrode | | | | solar cell characteristics | | | |
|---|---|---|---|---|---|---|---|---|
| | Second electroconductive layer | | Insulating | Width of collecting | | | | |
| | $d_2$ (μm) | Line width (μm) | layer $S_o/S_c$ | electrode (μm) | Voc (mV) | Jsc (mA/cm$^2$) | FF (%) | Eff (%) |
| Example 1 | 10 | 100 | 0.0 | 110 | 732 | 36.6 | 76.2 | 20.4 |
| Example 2 | 15 | 110 | 0.0 | 110 | 732 | 36.6 | 76.3 | 20.5 |
| Example 3 | 20 | 120 | 0.2 | 120 | 732 | 36.6 | 76.4 | 20.5 |
| Example 4 | 30 | 140 | 0.5 | 140 | 732 | 36.2 | 76.5 | 20.3 |
| Example 5 | 20 | 105 | 0.0 | 110 | 732 | 36.6 | 76.2 | 20.4 |
| Example 6 | 20 | 105 | 0.0 | 110 | 732 | 36.6 | 75.3 | 20.2 |
| Comparative Example 1 | 20 | 140 | 1.0 | 140 | 732 | 36.0 | 76.3 | 20.1 |

Comparison between Comparative Example 1 and Example 3 shows that there was no difference in thickness of the second electroconductive layer, but there was a difference in width of the second electroconductive layer between the former and the latter. That is, in Comparative Example 1 where the low-melting-point materials at the central portion and the non-central portion had the same density (the low-melting-point material was not unevenly distributed to the central portion), the width of the second electroconductive layer (collecting electrode width) was larger as compared to Example 3 where the low-melting-point material was unevenly distributed to the central portion. In Comparative Example 1, the shading area increased due to an increase in collecting electrode width, and therefore Jsc of the solar cell decreased.

From this result, it is apparent that by unevenly distributing the low-melting-point material to the central portion of the first electroconductive layer, openings of the insulating layer which are formed by the annealing treatment can be unevenly distributed to the central portion on the first electroconductive layer. Further, it has been confirmed that when openings of the insulating layer are unevenly distributed to the central portion on the first electroconductive layer, the width of the second electroconductive layer is reduced to suppress an increase in shading area by the second electroconductive layer, so that high Jsc is obtained.

Comparison between Example 3 and Example 6, where there was no difference in thickness of the second electroconductive layer, shows that higher performance is obtained in Example 3 where the first electroconductive layer was formed using a coating material having a high viscosity. As the viscosity of the coating material increases, the size of the line width of the first electroconductive layer after printing (before drying) of the first electroconductive layer decreases, and therefore when the width of the first electroconductive layer is kept constant, the printing width of the material (opening width of the screen) can be increased as the viscosity of the coating material increases. Thus, it is considered that in Example 3, the coating amount of the first electroconductive layer forming material could be increased, so that a first electroconductive layer having lower resistance was formed as compared to Example 6.

It is considered that in Example 3 where the first electroconductive layer had low resistance, the thickness of the second electroconductive layer formed by electroplating could be made more even within the second electroconductive layer-formed region, so that FF was improved as compared to Example 6, leading to improvement of Eff. From the above result, it is indicated that there is a suitable region for the viscosity of the first electroconductive layer material, and the suitable viscosity is considered to be about 250 Pa·s in this example.

In Example 2, the plating time during formation of the second electroconductive layer was longer, and therefore the second electroconductive layer had a larger thickness and width as compared to Example 1. On the other hand, in Example 1 and Example 2, the width of the second electroconductive layer was equal to or smaller than the width of the first electroconductive layer, and therefore there was no difference in the collecting electrode width and Jsc of the solar cell between the examples. It is considered that in Example 2, the second electroconductive layer had a larger thickness and a lower line resistance as compared to Example 1, so that FF increased, leading to improvement of Eff.

In Example 4 where the second electroconductive layer had a still larger thickness as compared to Example 2, the thickness of the second electroconductive layer increased, and accordingly the width of the second electroconductive layer increased, so that protrusion of the second electroconductive layer from the first electroconductive layer-formed region became significant, leading to a decrease in Jsc. In Example 3, the second electroconductive layer was formed so as to protrude from the first electroconductive layer-formed region, but Jsc comparable to that in Example 2 was obtained probably because the width of protrusion was small.

In Example 3 and Example 4, FF was improved as the thickness of the second electroconductive layer increased. From these results, it is apparent that by unevenly distributing the low-melting-point material in the first electroconductive layer to the central portion to reduce $M_O/M_C$, a second electroconductive layer having a large thickness and a small width of protrusion from the first electroconductive layer can be formed. Thus, the shading area by the collecting electrode can be reduced, and the resistance of the collecting electrode can be reduced to increase FF while Jsc is increased.

Comparison between Example 5 and Example 6 shows that Example 5, where the content of the low-melting-point material in the coating material was larger, exhibited a higher FF. This may be because in Example 5, the distance between low-melting-point materials in the first electroconductive layer was small, and therefore openings of the insulating layer were more densely formed, so that a region where second electroconductive layer materials overlap each other becomes larger, leading to a decrease in resistance of the second electroconductive layer.

As described above using Examples, according to the present invention, a collecting electrode of a solar cell can be prepared without patterning an insulating layer, thus making it possible to provide a high-power solar cell at low costs.

DESCRIPTION OF REFERENCE CHARACTERS 1 single-crystalline silicon substrate of first conductivity type
2a, 3a intrinsic silicon-based thin-film
3a, 3b conductive silicon-based thin-film
6a, 6b transparent electrode layer
7 collecting electrode
71 first electroconductive layer
711 low-melting-point material
72 second electroconductive layer
8 back side metal electrode
9 insulating layer
9h opening
50 photoelectric conversion section
100 solar cell
101 heterojunction solar cell

The invention claimed is:

1. A solar cell comprising: a photoelectric conversion section; and a plurality of collecting electrodes each extending in a first direction on a first principal surface of the photoelectric conversion section, wherein
each of the collecting electrodes includes a first electroconductive layer, an insulating layer provided with a plurality of openings, and a second electroconductive layer in this order from a photoelectric conversion section side,
each of the first electroconductive layer and the second electroconductive layer is patterned so as to linearly extend in the first direction,
the first electroconductive layer is covered with the insulating layer, and the second electroconductive layer contacts the first electroconductive layer via the plurality of openings of the insulating layer,
in a width direction that is orthogonal to the first direction and parallel to the first principal surface, the first electroconductive layer has non-central portions and a central portion between the non-central portions, and
a density of the plurality of openings of the insulating layer on the first electroconductive layer decreases in a width direction orthogonal to the first direction from the central portion.

2. The solar cell according to claim 1, wherein
the first electroconductive layer contains a metallic material having a thermal-fluidization onset temperature $T_1$ lower than a heat-resistant temperature of the photoelectric conversion section, and
the metallic material is unevenly distributed to the central portion of the first electroconductive layer.

3. The solar cell according to claim 2, wherein
the metallic material contained in the first electroconductive layer forms a plurality of island-like regions, and
a distance $d_{PL}$ in a plane defined by the first direction and the width direction between one of the island-like regions and an island-like region closest thereto satisfies a relationship of $d_{PL} \leq 2 \times (d_2 - d_I)$, wherein $d_2$ is a thickness of the second electroconductive layer and $d_I$ is a thickness of the insulating layer.

4. The solar cell according to claim 1, wherein $d_2$ is a thickness of the second electroconductive layer and satisfies $5\ \mu m \leq d_2 \leq 35\ \mu m$.

5. The solar cell according to claim 1, wherein
on the first principal surface of the photoelectric conversion section, the insulating layer is also formed in a first electroconductive layer-non-formed region where the first electroconductive layer is not formed.

6. The solar cell according to claim 1, wherein
the photoelectric conversion section comprises: a silicon-based thin-film; and a transparent electrode layer, in this order on a first principal surface of a crystalline silicon substrate, and
the collecting electrodes are formed on the transparent electrode layer.

7. The solar cell according to claim 1, wherein the first electroconductive layer contains metal particles or an aggregate of metal particles.

8. The solar cell according to claim 7, wherein the first electroconductive layer further contains a binder resin.

9. The solar cell according to claim 1, wherein in the width direction, a line width $L_{T1}$ of the first electroconductive layer, a line width $L_F$ of the second electroconductive layer, and a thickness $d_2$ of the second electroconductive layer satisfies the relationship of $L_F \leq L_{T1} + d_2$.

10. The solar cell according to claim 2, wherein the metallic material contained in the first electroconductive layer includes metal particles or an aggregate of metal particles.

11. The solar cell according to claim 10, wherein the first electroconductive layer further contains a binder resin.

12. The solar cell according to claim 2, wherein the metallic material contained in the first electroconductive layer has a thermal-fluidization onset temperature $T_1$ of 250° C. or lower.

13. A manufacturing method of a solar cell having a photoelectric conversion section and a plurality of collecting electrodes each extending in a first direction on a first principal surface of the photoelectric conversion section, each of the collecting electrodes including a first electroconductive layer, an insulating layer provided with a plurality of openings, and a second electroconductive layer in this order from a photoelectric conversion section side, the method comprising:
a first electroconductive layer forming step of forming the first electroconductive layer patterned so as to linearly extend in the first direction on the first principal surface of a photoelectric conversion section;
an insulating layer forming step of forming the insulating layer on the first electroconductive layer to cover the first electroconductive layer; and
a plating step of forming the second electroconductive layer patterned so as to linearly extend in the first direction by a plating method, the second electroconductive layer contacting the first electroconductive layer via the plurality of openings of the insulating layer, in this order, wherein
in a width direction that is orthogonal to the first direction and parallel to the first principal surface, the first electroconductive layer has non-central portions central portion between the non-central portions, and a density of the plurality of openings of the insulating layer on the first electroconductive layer decreases in a width direction orthogonal to the first direction from the central portion.

14. The manufacturing method of the solar cell according to claim 13, wherein
in the first electroconductive layer forming step, a coating material having a viscosity of 10 to 500 Pa·s is applied onto the first principal surface of the photoelectric conversion section, and then the coating material is cured to form the first electroconductive layer.

15. The manufacturing method of the solar cell according to claim 13, wherein
the first electroconductive layer contains a metallic material having a thermal-fluidization onset temperature $T_1$ lower than a heat-resistant temperature of the photoelectric conversion section, and
after the insulating layer forming step, a heat treatment is carried out at an annealing temperature Ta higher than $T_1$, thereby the plurality of openings are formed in the insulating layer on the first electroconductive layer.

16. The manufacturing method of the solar cell according to claim 13, wherein
in the insulating layer forming step, the insulating layer is also formed on a first electroconductive layer-non-formed region where the first electroconductive layer is not formed on the first principal surface of the photoelectric conversion section.

17. The manufacturing method of the solar cell according to claim 13, wherein
the photoelectric conversion section comprises: a silicon-based thin-film; and a transparent electrode layer, in this order on a first principal surface of a crystalline silicon substrate, and
the collecting electrodes are formed on the transparent electrode layer.

18. A manufacturing method of a solar cell module, comprising:
a step of manufacturing the solar cell by the method according to claim 13; and
a step of sealing the solar cell, in this order.

\* \* \* \* \*